(12) United States Patent
Alameh et al.

(10) Patent No.: US 8,304,733 B2
(45) Date of Patent: Nov. 6, 2012

(54) SENSING ASSEMBLY FOR MOBILE DEVICE

(75) Inventors: Rachid Alameh, Crystal Lake, IL (US);
Patrick Cauwels, South Beloit, IL (US);
Jun Jiang, Lake Zurich, IL (US);
Kenneth Paitl, West Dundee, IL (US)

(73) Assignee: Motorola Mobility LLC, Libertyville, IL (US)

( * ) Notice: Subject to any disclaimer, the term of this patent is extended or adjusted under 35 U.S.C. 154(b) by 312 days.

(21) Appl. No.: 12/471,062

(22) Filed: May 22, 2009

(65) Prior Publication Data

US 2010/0294938 A1    Nov. 25, 2010

(51) Int. Cl.
*G01J 5/02* (2006.01)

(52) U.S. Cl. ........................................ 250/349

(58) Field of Classification Search .................. 250/349, 250/399.1
See application file for complete search history.

(56) References Cited

U.S. PATENT DOCUMENTS

| | | | |
|---|---|---|---|
| 4,286,289 A | 8/1981 | Ottensen et al. | |
| 4,806,709 A | 2/1989 | Evans | |
| 4,914,624 A | 4/1990 | Dunthorn | |
| 4,967,083 A | 10/1990 | Kornbrekke et al. | |
| 5,179,369 A | 1/1993 | Person et al. | |
| 5,414,413 A | 5/1995 | Tamaru et al. | |
| 5,684,294 A | 11/1997 | Kouhi | |
| 5,781,662 A | 7/1998 | Mori et al. | |
| 5,821,521 A | 10/1998 | Bridgelall et al. | |
| 5,945,988 A | 8/1999 | Williams et al. | |
| 6,002,427 A | 12/1999 | Kipust | |
| 6,107,994 A | 8/2000 | Harada et al. | |
| 6,184,538 B1 * | 2/2001 | Bandara et al. | 257/21 |
| 6,215,116 B1 | 4/2001 | Van Marcke | |
| 6,246,407 B1 | 6/2001 | Wilks et al. | |
| 6,246,862 B1 | 6/2001 | Grivas | |
| 6,292,674 B1 | 9/2001 | Davis | |
| 6,330,457 B1 | 12/2001 | Yoon | |
| 6,438,752 B1 | 8/2002 | McClard | |

(Continued)

FOREIGN PATENT DOCUMENTS

EP    1445922 A1    8/2004

(Continued)

OTHER PUBLICATIONS

Pavlov et al., "Model-based object characterization with active infrared sensor array," 2007, IEEE Sensors 2007 Conference, pp. 360-363.*

(Continued)

*Primary Examiner* — Kiho Kim

(57) ABSTRACT

An infrared sensing assembly for allowing detection of a location of an external object, as well as a mobile device employing such an assembly and related methods of operation, among other things, are disclosed. In one exemplary embodiment, the sensing assembly includes a pyramid-type housing structure having a central surface and multiple outer surfaces each of which extends in an inclined manner away from the central surface. The sensing assembly further includes multiple phototransmitters each positioned proximate to a respective one of the outer surfaces, and a photoreceiver positioned proximate to the central surface, with each respective photoelectric device being oriented so as to correspond to its respective surface. The sensing assembly is operated so that light is emitted from the phototransmitters, reflected by the object, and received by the photoreceiver. By processing signals from the photoreceiver that are indicative of the received light, the external object's location is determined.

17 Claims, 11 Drawing Sheets

U.S. PATENT DOCUMENTS

| | | | |
|---|---|---|---|
| 6,460,183 B1 | 10/2002 | Van Der Vleuten | |
| 6,525,854 B1 | 2/2003 | Takahashi et al. | |
| 6,721,954 B1 | 4/2004 | Nickum | |
| 6,804,012 B2 | 10/2004 | Gombert | |
| 6,816,154 B2 | 11/2004 | Wong et al. | |
| 6,933,922 B2 | 8/2005 | Casebolt et al. | |
| 6,941,161 B1 | 9/2005 | Bobisuthi et al. | |
| 7,046,230 B2 | 5/2006 | Zadesky et al. | |
| 7,134,092 B2 | 11/2006 | Fung et al. | |
| 7,166,966 B2 | 1/2007 | Naugler, Jr. et al. | |
| 7,212,835 B2 | 5/2007 | Mantyjarvi et al. | |
| 7,340,077 B2 | 3/2008 | Gorturk et al. | |
| 7,368,703 B2 | 5/2008 | De Samber et al. | |
| 7,380,716 B2 | 6/2008 | Yokoyama | |
| 7,468,689 B2 | 12/2008 | Ma et al. | |
| 7,486,386 B1 | 2/2009 | Holcombe et al. | |
| 7,489,297 B2 | 2/2009 | Hohmann et al. | |
| 7,519,918 B2 | 4/2009 | Trantow | |
| 7,532,196 B2 | 5/2009 | Hinckley | |
| 7,534,988 B2 | 5/2009 | Kong et al. | |
| 7,557,965 B2 | 7/2009 | Taylor et al. | |
| 7,561,146 B1 | 7/2009 | Hotelling | |
| 7,630,716 B2 | 12/2009 | Tamura et al. | |
| 7,687,774 B2 | 3/2010 | Ohta et al. | |
| 7,715,723 B2 | 5/2010 | Kagawa et al. | |
| 7,721,310 B2 | 5/2010 | Schaffer et al. | |
| 7,728,958 B2 | 6/2010 | Pfaff | |
| 7,795,584 B2 | 9/2010 | Mok et al. | |
| 7,855,716 B2 | 12/2010 | McCreary et al. | |
| 7,912,376 B2 | 3/2011 | Rollins | |
| 7,971,156 B2 | 6/2011 | Albertson et al. | |
| 7,991,896 B2 | 8/2011 | Shen et al. | |
| 8,006,002 B2 | 8/2011 | Kalayjian et al. | |
| 8,018,501 B2 | 9/2011 | Sasaki | |
| 8,023,061 B2 | 9/2011 | Ra | |
| 8,072,469 B2 | 12/2011 | Ottney | |
| 8,104,113 B2 | 1/2012 | Rodenbeck et al. | |
| 2001/0019338 A1 | 9/2001 | Roth | |
| 2002/0104081 A1 | 8/2002 | Candelore et al. | |
| 2002/0122072 A1 | 9/2002 | Selker | |
| 2002/0199186 A1 | 12/2002 | Ali et al. | |
| 2003/0063128 A1 | 4/2003 | Salmimaa et al. | |
| 2003/0222917 A1 | 12/2003 | Trantow | |
| 2005/0104860 A1 | 5/2005 | McCreary et al. | |
| 2005/0150697 A1 | 7/2005 | Altman et al. | |
| 2005/0232447 A1 | 10/2005 | Shinozuka et al. | |
| 2005/0289182 A1 | 12/2005 | Pandian et al. | |
| 2006/0010400 A1 | 1/2006 | Dehlin et al. | |
| 2006/0028453 A1* | 2/2006 | Kawabe | 345/173 |
| 2006/0031786 A1 | 2/2006 | Hillis et al. | |
| 2006/0059152 A1 | 3/2006 | Nakamura | |
| 2006/0125799 A1 | 6/2006 | Hillis et al. | |
| 2006/0132456 A1 | 6/2006 | Anson | |
| 2006/0161870 A1 | 7/2006 | Hotelling et al. | |
| 2006/0161871 A1 | 7/2006 | Hotelling et al. | |
| 2006/0256074 A1 | 11/2006 | Krum et al. | |
| 2007/0109266 A1 | 5/2007 | Davis et al. | |
| 2007/0137462 A1* | 6/2007 | Barros et al. | 84/453 |
| 2007/0177803 A1 | 8/2007 | Elias et al. | |
| 2007/0180392 A1 | 8/2007 | Russo | |
| 2007/0220437 A1 | 9/2007 | Boillot | |
| 2007/0247643 A1 | 10/2007 | Nakamura et al. | |
| 2008/0005703 A1 | 1/2008 | Radivojevic et al. | |
| 2008/0006762 A1 | 1/2008 | Fadell et al. | |
| 2008/0024454 A1 | 1/2008 | Everest | |
| 2008/0052643 A1 | 2/2008 | Ike et al. | |
| 2008/0079902 A1 | 4/2008 | Mandelstam-Manor et al. | |
| 2008/0122803 A1 | 5/2008 | Izadi et al. | |
| 2008/0129688 A1 | 6/2008 | Richardson et al. | |
| 2008/0161870 A1 | 7/2008 | Gunderson | |
| 2008/0165140 A1 | 7/2008 | Christie et al. | |
| 2008/0192005 A1 | 8/2008 | Elgoyhen et al. | |
| 2008/0195735 A1 | 8/2008 | Hodges et al. | |
| 2008/0204427 A1 | 8/2008 | Heesemans et al. | |
| 2008/0211771 A1 | 9/2008 | Richardson | |
| 2008/0219672 A1 | 9/2008 | Tam et al. | |
| 2008/0225041 A1 | 9/2008 | El Dokor et al. | |
| 2008/0240568 A1 | 10/2008 | Tonouchi | |
| 2008/0252595 A1 | 10/2008 | Boillot | |
| 2008/0256494 A1 | 10/2008 | Greenfield | |
| 2008/0266083 A1 | 10/2008 | Midholt et al. | |
| 2008/0280642 A1 | 11/2008 | Coxhill et al. | |
| 2008/0284738 A1 | 11/2008 | Hovden et al. | |
| 2008/0297487 A1 | 12/2008 | Hotelling et al. | |
| 2008/0303681 A1 | 12/2008 | Herz et al. | |
| 2008/0309641 A1 | 12/2008 | Harel et al. | |
| 2009/0021488 A1 | 1/2009 | Kali et al. | |
| 2009/0031258 A1 | 1/2009 | Arrasvuori et al. | |
| 2009/0061823 A1 | 3/2009 | Chu | |
| 2009/0092284 A1 | 4/2009 | Breed et al. | |
| 2009/0158203 A1 | 6/2009 | Kerr et al. | |
| 2009/0277697 A1 | 11/2009 | Bolt et al. | |
| 2009/0299633 A1* | 12/2009 | Hawes et al. | 701/300 |
| 2009/0303176 A1* | 12/2009 | Chen et al. | 345/156 |
| 2011/0009194 A1* | 1/2011 | Gabai et al. | 463/36 |
| 2012/0046906 A1 | 2/2012 | Alameh et al. | |

FOREIGN PATENT DOCUMENTS

| | | |
|---|---|---|
| EP | 1657819 A2 | 5/2006 |
| EP | 1760573 A2 | 3/2007 |
| EP | 2000896 A2 | 12/2008 |
| EP | 2037349 A2 | 3/2009 |
| JP | 02280427 A | 11/1990 |
| JP | 2005293419 A | 10/2005 |
| JP | 2006010489 A | 1/2006 |
| JP | 2007042020 A | 2/2007 |
| JP | 2009085799 A | 4/2009 |
| KR | 20030044749 A | 6/2003 |
| KR | 1020050100642 A | 10/2005 |
| WO | 9528777 A1 | 10/1995 |
| WO | 0241129 A2 | 5/2002 |
| WO | 03023701 A2 | 3/2003 |
| WO | 03076870 A1 | 9/2003 |
| WO | 2005076542 A1 | 8/2005 |
| WO | 2005101176 A2 | 10/2005 |
| WO | 2008016394 A2 | 2/2008 |
| WO | 2008073289 A3 | 6/2008 |

OTHER PUBLICATIONS

H. Crhistensen, "Retrieval of 3D-position of a passive object using infrared LED's and photodiodes," 2005, IEEE, pp. IV-1093-IV1096.*

Kim et al., "The gesture watch: a wireless contact-free gesture based wrist interface," 2007, 11th IEEE International Symposium on Wearable Computers, pp. 15-22.*

PCT, "Notification of Transmittal of the International Search Report and the Written Opinion of the International Searching Authority, or the Declaration", Sep. 30, 2010, pp. 1-13, PCT/US/2010/039561, European Patent Office.

Patent Cooperation Treaty, "PCT Search Report and Written Opinion of the International Searching Authority" for International Application No. PCT/US2009/066555 Jul. 16, 2010, 11 pages.

U.S. Appl. No. 12/428,187, filed Apr. 22, 2009 "Menu Configuration System and Method for Display on an Electronic Device".

U.S. Appl. No. 12/428,266, filed Apr. 22, 2009 "Touch-Screen and Method for an Electronic Device".

U.S. Appl. No. 12/500,625, filed Jul. 10, 2009 "Devices and Methods for Adjusting Proximity Detectors".

Specification of the Bluetooth System; Master Table of Contents & Compliance Requirements; Covered Core Package V. 3.0 +HS; Apr. 21, 2009; 192 pages.

G.Yun and M.Kavehrad, "Spot diffusing and fly-eye receivers for indoor infrared wireless communications", Proc. 1992 IEEE, Conf. Sel, Topics in Wireless Comm., Vancouver, BC, Canada, Jun. 25-26, 1992, pp. 286-292.

Kahn, J.M.; You, R., Djahani, P., Weisbin, A.G."Imaging Diversity Receivers for high-speed infrared wireless communication", IEEE Communications Mag., Dec. 1998, Accessed May 7, 2009; 7 pages.

Ward, A.; Jones A.; Hopper A.; "A new location technique for the active office"; IEEE Personal Communications, 1997; accessed May 7, 2009; 11 pages.

Metzger, C.; Anderson, M.; Starner, T.; "FreeDigiter: A contact-free device for gesture control"; Wearable Computers, 2004; ISWC 2004, 8th International Symposium, vol. 1, Oct. 31/Oct. 4, 2004, pp. 18-21.

Von Hardenberg, C.; Berard F.; "Bare-hand human-computer interaction" PUI; ACM 1-58113-448-7 Nov. 14, 2001; Orlando, FL, USA; 8 pages.

TrackIR: Vector Expansion: True 6DOF view control offer 3-dimensional virtual reality via motion control; TRACKIR by NaturalPoint; www.naturalpoint.com; 2 pages Aug. 2005.

Bricklin, D.; Gestures, the iPhone, and Standards: A Developer's Questions, www.bricklin.com, 10 pages, 1999-2009.

Gearlog, Microsoft's sidesight: something Apple show watch, www.gearlog.com; 5 pages, 1996-2008, Ziff Davis Publ. Holdings, Inc.

Hadamard transform—Wikipedia definition; http://en.wikipedia.org/wiki/Hadamard_transform; 4 pages, Oct. 2009.

Silicon Laboratories, Inc.; Si1120 Evaluation Kit User's Guide, Austin, TX, Dec. 2009, 10 pages; www.silabs.com/support/pages/contacttechnicalsupport.aspx.

US Appl. No. 12/643,211, filed Dec. 21, 2009; "Electronic device with sensing assembly and method for interpreting consecutive gestures."

US Appl. No. 12/640,867, filed Dec. 17, 2009, "Electronic device with sensing assembly and method for detecting basic gestures."

US Appl. No. 12/646,601, filed Dec. 23, 2009, "Electronic device with sensing assembly and method for detecting gestures of geometric shapes."

US Appl. No. 12/648,503, filed Dec. 29, 2009, "Electronic device with sensing assembly and method for interpreting offset gestures."

US Appl. No. 12/641,830, filed Dec. 18, 2009, "Mobile device with user interaction capability and method of operating same."

US Appl. No. 12/645,244, filed Dec. 22, 2009, "Method and system for conducting communication between mobile devices."

US Appl. No. 12/646,199, filed Dec. 23, 2009, "Method and system for controlling data transmission to or from a mobile device."

US Appl. No. 12/344,760, filed Dec. 29, 2008, "Portable electronic device having self-calibrating proximity sensors."

US Appl. No. 12/347,146, filed Dec. 31, 2008, "Portable electronic device having directional proximity sensors based on device orientation."

USPTO U.S. Appl. No. 12/344,760 Notice of Allowance dated Jan. 3, 2011, 9 pages.

Patent Cooperation Treaty, "PCT Search Report and Written Opinion of the International Searching Authority" for International Application No. PCT/US2010/030964 Nov. 9, 2010, 24 pages.

Patent Cooperation Treaty, "PCT Search Report and Written Opinion of the International Searching Authority" for International Application No. PCT/US2010/033472 Dec. 15, 2010, 9 pages.

Patent Cooperation Treaty, "PCT Search Report and Written Opinion of the International Searching Authority" for International Application No. PCT/US2010/028654 Dec. 1, 2010, 22 pages.

Patent Cooperation Treaty, "PCT Search Report and Written Opinion of the International Searching Authority" for International Application No. PCT/US2010/061254 Apr. 7, 2011, 16 pages.

Patent Cooperation Treaty, "PCT Search Report and Written Opinion of the International Searching Authority" for International Application No. PCT/US2010/061261 Mar. 17, 2011, 14 pages.

United States Patent and Trademark Office, U.S. Appl. No. 12/347,146 Non-Final Office Action dated Jul. 18, 2011, 9 pages.

United States Patent and Trademark Office, U.S. Appl. No. 12/428,260 Non-Final Office Action dated Oct. 15, 2011, 10 pages.

United States Patent and Trademark Office "Non-Final Rejecton" for U.S. Appl. No. 12/646,601 Feb. 14, 2012. 9 pages.

Kim, et al., "The gesture watch: a wireless contact-free gesture based wrist interface", 2007, 11th IEEE International Symposium on Wearable Computers, pp. 15-22.

Starner et al., The gesture pendant. A self-illuminating, wearable, infared computer vision system for home automation control and medical monitoring:, 2000, IEEE 4th Internatioinal Symposium on Wearable Computers, pp. 87-94 .

United States Patent and Trademark Office "Non-Final Rejection" for U.S. Appl. No. 12/471,062 Sep. 30, 2011, 11 pages.

H. Ruser, Object recognition with a smart low-cost active infared sensor array:, Nov. 21-23, 2005, 1st International Conference on Sensing Technology, pp. 494-499.

United States Patent and Trademark Office "Final Rejection" for U.S. Appl. No. 12/471,062 Mar. 30, 2012, 11 pages.

United States Patent and Trademark Office "Non-Final Rejection" for U.S. Appl. No. 12/428,187 Oct. 26, 2011, 8 pages.

United States Patent and Trademark Office "Final Rejection" for U.S. Appl. No. 12/428,187 Apr. 10, 2012, 10 pages.

United States Patent and Trademark Office "Final Rejection" for U.S. Appl. No. 12/428,266 Mar. 14, 2012, 9 pages.

United States Patent and Trademark Office "Non-Final Rejection" for U.S. Appl. No. 12/500,625 Dec. 29, 2011, 7 pages.

United States Patent and Trademark Office "Non-Final Rejection" for U.S. Appl. No. 12/646,199 Mar. 7, 2012, 17 pages.

United States Patent and Trademark Office "Non-Final Rejection" for U.S. Appl. No. 12/648,503 Feb. 17, 2012, 7 pages.

United States Patent and Trademark Office "Non-Final Rejection" for U.S. Appl. No. 13/283,984, Dec. 21, 2012, 9 pages.

United States Patent and Trademark Office "Non-Final Rejection" for U.S. Appl. No. 12/645,244 May 24, 2012, 8 pages.

* cited by examiner

SENSING ASSEMBLY FOR MOBILE DEVICE

CROSS-REFERENCE TO RELATED APPLICATIONS

--

STATEMENT REGARDING FEDERALLY SPONSORED RESEARCH OR DEVELOPMENT

--

FIELD OF THE INVENTION

The present invention relates generally to mobile devices and, more particularly, to systems and methods capable of being implemented on mobile devices allowing for the sensing of the presence or location of items (including the presence of human beings) nearby the mobile devices.

BACKGROUND OF THE INVENTION

Mobile devices such as cellular telephones, smart phones and other handheld or portable electronic devices such as personal digital assistants (PDAs), headsets, MP3 players, etc. have become popular and ubiquitous. As more and more features have been added to mobile devices, there has been an increasing desire to equip mobile devices with input/output mechanisms that accommodate numerous user commands and/or react to numerous user behaviors. For example, many mobile devices are now equipped not only with buttons or keys/keypads, but also with capacitive touchscreens by which a user, simply by touching the surface of the mobile device and/or moving the user's finger along the surface of the mobile device, is able to communicate to the mobile device a variety of messages or instructions.

It is of increasing interest that mobile devices be capable of detecting the presence of, and determining with some accuracy the position of, physical objects located outside of the mobile devices and, more particularly, the presence and location of human beings (or portions of their bodies, such as their heads or hands) who are using the mobile devices or otherwise are located nearby the mobile devices. By virtue of such capabilities, the mobile devices are able to adjust their behavior in a variety of manners that are appropriate given the presence (or absence) and location of the human beings and/or other physical objects.

Although prior art devices such as capacitive touchscreens are useful as input/output devices for phones, such touchscreens are fairly complicated electronic devices that are expensive and that require a large number of sensing devices that are distributed in location across a large surface area of the phone. Also, such touchscreens are limited insofar as they only allow a user to provide input signals if the user is actually physically touching the touchscreens. Further, while remote sensing devices such as infrared (or, more accurately, near-infrared) transceivers have been employed in the past in some mobile devices to allow for the detection of the presence and/or location of human beings and/or physical objects even when not in physical contact with the mobile devices, such sensing devices have been limited in various respects.

In particular, some such transceivers in some such mobile devices are only able to detect the presence of a human being/physical object within a certain distance from the given transceiver (e.g., detect that the human being/physical object is within a predetermined distance or proximity to the transceiver), but not able to detect the three-dimensional location of the human being/physical object in three-dimensional space relative to the transceiver. Also, some such transceivers in some such mobile devices are undesirably complicated or require large numbers of components in order to operate, which in turn renders such devices unduly expensive.

Therefore, for the above reasons, it would be advantageous if a new sensing device or sensing devices suitable for one or more types of mobile devices could be developed that overcame one or more of the above-described limitations, and/or one or more other limitations.

BRIEF SUMMARY OF THE INVENTION

In at least some embodiments, the present invention relates to an infrared sensing assembly for allowing detection of a location of an external object. The sensing assembly includes a pyramid-type housing structure having a central surface and a plurality of outer surfaces each of which extends in an inclined manner away from the central surface, and a plurality of first photoelectric devices, where each respective first photoelectric device is positioned proximate to a respective one of the outer surfaces. The sensing assembly further includes a second photoelectric device that is positioned proximate to the central surface, where either each of the first photoelectric devices is a phototransmitter and the second photoelectric device is a photoreceiver, or vice-versa. Each respective photoelectric device is oriented so as to correspond to the respective surface proximate to which the respective photoelectric device is positioned, and the sensing assembly is operated so that infrared light is communicated between the second photoelectric device and at least two of the first photoelectric devices, whereby the location of the object can be determined based upon the communicated infrared light, which is reflected off of the external object during transit.

Further, in at least some embodiments, the present invention relates to a mobile device including an infrared sensing assembly by which a determination as to a location of an external object can be made. The mobile device includes at least one photoreceiver, and a plurality of phototransmitters, where the respective phototransmitters are actuated to emit respective infrared light portions during respective successive time windows. The mobile device also includes a pyramid-type structure having a central surface and a plurality of outer surfaces extending away from the central surface, where each outer surface is inclined relative to the central surface. The mobile device further includes a processing device coupled to each one of the at least one photoreceiver and the plurality of phototransmitters, where the processing device makes the determination of the location of the external object based upon a plurality of signals provided at least indirectly to the processing device from the at least one photoreceiver, where each respective signal is indicative of a respective reflected light portion received by the at least one photoreceiver during a respective one of the time windows during which was emitted a respective one of the infrared light portions. Each respective phototransmitter is either oriented in a manner corresponding to a respective orientation of a respective one of the outer surfaces with which the respective phototransmitter is associated, or directs light for reflection or refraction toward the respective one of the outer surfaces.

Additionally, in at least some embodiments, the present invention relates to a method of determining a location of an external object relative to a mobile device. The method includes (a) providing a pyramid-type structure as part of the mobile device, the pyramid-type structure having a central surface and a plurality of outer surfaces extending away from the central surface and being inclined in relation thereto, and (b) actuating a plurality of infrared phototransmitters within a plurality of sequential time windows, respectively, so that infrared light is directed outward away from the mobile device in a plurality of directions corresponding respectively to respective orientations of the outer surfaces. The method also includes (c) receiving by way of at least one infrared photoreceiver a plurality of reflected light portions during the plurality of sequential time windows, respectively, where each respective one of the reflected light portions includes a respective amount of the infrared light that was directed outward away from the mobile device as a result of the actuating of a respective one of the infrared phototransmitters during the respective sequential time window. The method further includes (d) determining the location of the external object based upon signals from the at least one infrared photoreceiver indicative of the received reflected light portions.

DETAILED DESCRIPTION OF THE PREFERRED EMBODIMENT

Figure 1:
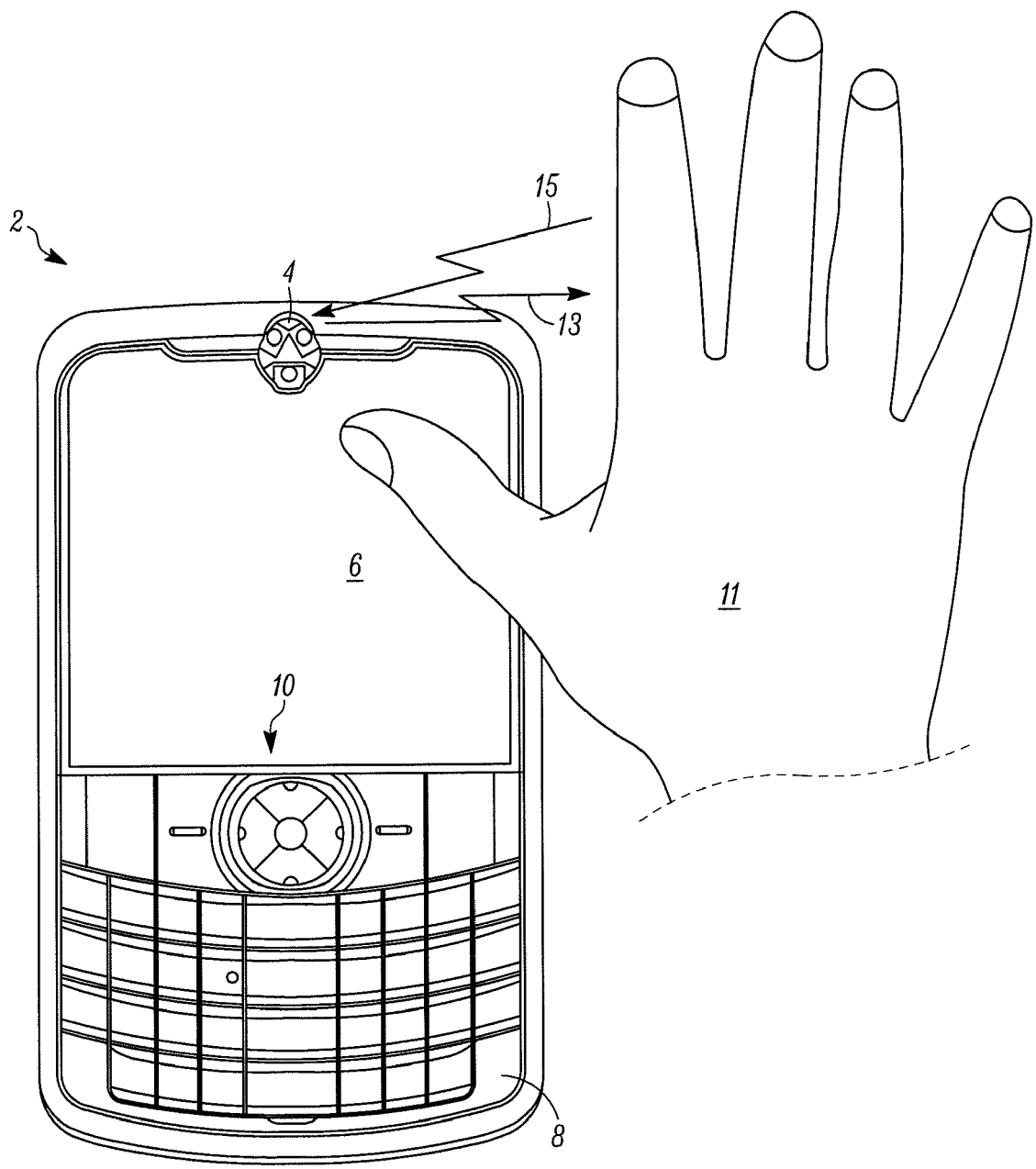
FIG. 1 is a front elevation view of an exemplary mobile device that employs an exemplary pyramid-type sensing assembly capable of allowing sensing of the location of an exemplary external object (shown partially in cut-away), in accordance with one embodiment of the present invention.

Referring to FIG. 1, an exemplary mobile device 2 is shown that includes, among its various components, an exemplary sensing assembly 4, in accordance with a first embodiment of the present invention. In the present example shown, the mobile device 2 is a personal digital assistant (PDA), albeit the mobile device is also intended to be representative of a variety of other mobile devices that are encompassed within the scope of the present invention including, for example, cellular telephones, smart phones, other handheld or portable electronic devices such as notebook or laptop computing devices, headsets, MP3 players and other portable video and audio players, navigation devices (e.g., such as those sold by Garmin International, Inc. of Olathe, Kans.), touch screen input devices, pen-based input devices, other mobile devices and even other devices, including a wide variety of devices that can utilize or benefit from directional control or control based upon the sensed presence and location of one or more external objects (e.g., televisions, kiosks, ATM, vending machines, automobiles, etc.). Further included among the components of the mobile device 2 as shown in FIG. 1 are a video screen 6, a keypad 8 having numerous keys, and a navigation device (in this case, a "five-way navigation area") 10.

As will be described in further detail with respect to FIG. 3, the sensing assembly 4 in the present embodiment is a first embodiment of a pyramid-type sensing assembly that is capable of being used to detect the presence of an object (or a collection of objects) external to the mobile device 2 (and external to the sensing assembly itself). Depending upon the circumstance, the physical object (or objects) that is sensed can include a variety of inanimate objects and/or, in at least some circumstances, one or more portions of the body of a human being who is using the phone (or otherwise is in proximity to the phone) such as the human being's head or, as shown (partly in cutaway), a hand 11 of the human being. In the present embodiment, the sensing assembly 4 not only detects the presence of such an object in terms of whether such object is sufficiently proximate to the sensing assembly (and/or the mobile device), but also detects the object's three-dimensional location relative to the mobile device 2 in three-dimensional space.

In the present embodiment, the sensing assembly 4 operates in particular by transmitting one or more (typically multiple) infrared signals 13 out of the sensing assembly, the infrared signals 13 being generated by one or more infrared phototransmitters (e.g., photo-light emitting diodes (photo-LEDs)). More particularly, the phototransmitters can, but need not, be near-infrared photo-LEDs transmitting light having wavelength(s) in the range of approximately 850 to 890 nanometers. Portions of the infrared signal(s) 13 are then reflected by an object or objects that is/are present such as the hand 11, so as to constitute one or more reflected signals 15. The reflected signals 15 are in turn sensed by one or more infrared light sensing devices or photoreceivers (e.g., photodiodes), which more particularly can (but need not) be suited for receiving near-infrared light having wavelength(s) in the aforementioned range. As will be described in further detail below, by virtue of employing either multiple phototransmitters or multiple photoreceivers, the three-dimensional position of the hand 11 relative to the sensing assembly (and thus relative to the mobile device) can be accurately determined.

Figure 2:
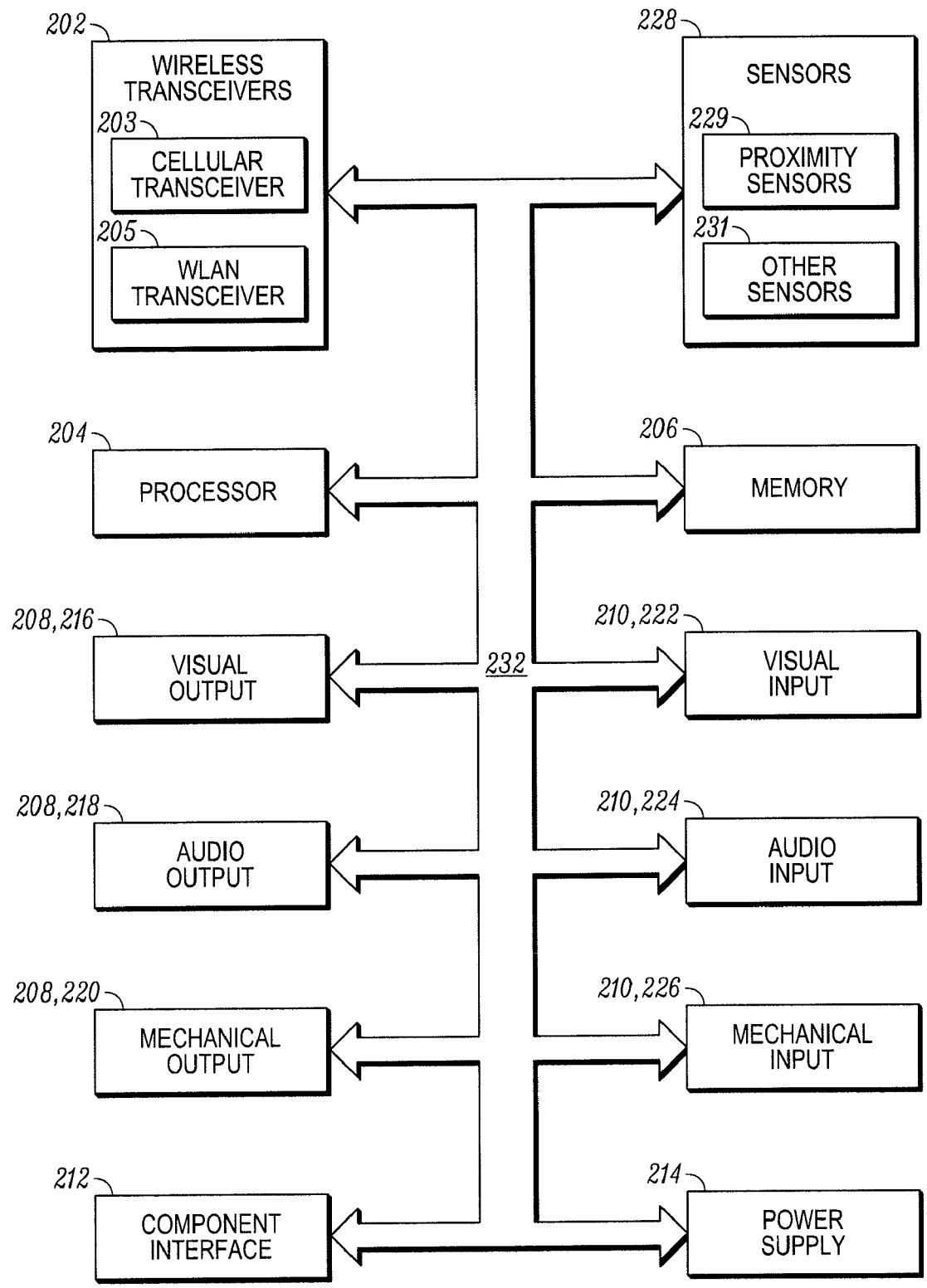
FIG. 2 is a block diagram illustrating exemplary components of the mobile device of FIG. 1.

Referring to FIG. 2, there is provided a block diagram illustrating exemplary internal components 200 of a mobile device such as the mobile device 2, in accordance with the present invention. The exemplary embodiment includes wireless transceivers 202, a processor 204 (e.g., a microprocessor, microcomputer, application-specific integrated circuit, etc.), a memory portion 206, one or more output devices 208, and one or more input devices 210. In at least some embodiments, a user interface is present that comprises one or more output devices 208 and one or more input device 210. The internal components 200 can further include a component interface 212 to provide a direct connection to auxiliary components or accessories for additional or enhanced functionality. The internal components 200 preferably also include a power supply 214, such as a battery, for providing power to the other internal components while enabling the mobile device 2 to be portable. As will be described in further detail, the internal components 200 in the present embodiment further include sensors 228 such as the sensing assembly 4 of FIG. 1. All of the internal components 200 can be coupled to one another, and in communication with one another, by way of one or more internal communication links 232 (e.g., an internal bus).

Each of the wireless transceivers 202 utilizes a wireless technology for communication, such as, but not limited to, cellular-based communication technologies such as analog communications (using AMPS), digital communications (using CDMA, TDMA, GSM, iDEN, GPRS, EDGE, etc.), and next generation communications (using UMTS, WCDMA, LTE, IEEE 802.16, etc.) or variants thereof, or peer-to-peer or ad hoc communication technologies such as HomeRF, Bluetooth and IEEE 802.11 (a, b, g or n), or other wireless communication technologies such as infrared technology. In the present embodiment, the wireless transceivers 202 include both cellular transceivers 203 and a wireless local area network (WLAN) transceiver 205 (which particularly can employ infrared technology), although in other embodiments only one of these types of wireless transceivers (and possibly neither of these types of wireless transceivers, and/or other types of wireless transceivers) is present. Also, the number of wireless transceivers can vary and, in some embodiments, only one wireless transceiver is present and further, depending upon the embodiment, each wireless transceiver 202 can include both a receiver and a transmitter, or only one or the other of those devices.

Exemplary operation of the wireless transceivers 202 in conjunction with others of the internal components 200 of the mobile device 2 can take a variety of forms and can include, for example, operation in which, upon reception of wireless signals, the internal components detect communication signals and the transceiver 202 demodulates the communication signals to recover incoming information, such as voice and/or data, transmitted by the wireless signals. After receiving the incoming information from the transceiver 202, the processor 204 formats the incoming information for the one or more output devices 208. Likewise, for transmission of wireless signals, the processor 204 formats outgoing information, which may or may not be activated by the input devices 210, and conveys the outgoing information to one or more of the wireless transceivers 202 for modulation to communication signals. The wireless transceiver(s) 202 convey the modulated signals to a remote device, such as a cell tower or a remote server (not shown).

Depending upon the embodiment, the input and output devices 208, 210 of the internal components 200 can include a variety of visual, audio and/or mechanical outputs. For example, the output device(s) 208 can include a visual output device 216 such as a liquid crystal display and light emitting diode indicator, an audio output device 218 such as a speaker, alarm and/or buzzer, and/or a mechanical output device 220 such as a vibrating mechanism. The visual output devices 216 among other things can include the video screen 6 of FIG. 1. Likewise, by example, the input devices 210 can include a visual input device 222 such as an optical sensor (for example, a camera), an audio input device 224 such as a microphone, and a mechanical input device 226 such as a flip sensor, keyboard, keypad, selection button, touch pad, touch-screen, capacitive sensor, motion sensor, and switch. The mechanical input device 226 can in particular include, among other things, the keypad 8 and the navigation device 10 of FIG. 1. Actions that can actuate one or more input devices 210 can include, but need not be limited to, opening the mobile device, unlocking the device, moving the device to actuate a motion, moving the device to actuate a location positioning system, and operating the device.

Although the sensors 228 of the internal components 200 can in at least some circumstances be considered as being encompassed within input devices 210, given the particular significance of one or more of these sensors 228 to the present embodiment the sensors instead are described independently of the input devices 210. In particular as shown, the sensors 228 can include both proximity sensors 229 and other sensors 231. As will be described in further detail, the proximity sensors 229 can include, among other things, one or more sensors such as the sensing assembly 4 of FIG. 1 by which the mobile device 2 is able to detect the presence of (e.g., the fact that the mobile device is in sufficient proximity to) and location of one or more external objects including portions of the body of a human being such as the hand 11 of FIG. 1. By comparison, the other sensors 231 can include other types of sensors, such as a location circuit 228 that can include, for example, a Global Positioning System (GPS) receiver, a triangulation receiver, an accelerometer, a gyroscope, or any other information collecting device that can identify a current location of the mobile device 2.

The memory portion 206 of the internal components 200 can encompass one or more memory devices of any of a variety of forms (e.g., read-only memory, random access memory, static random access memory, dynamic random access memory, etc.), and can be used by the processor 204 to store and retrieve data. The data that is stored by the memory portion 206 can include, but need not be limited to, operating systems, applications, and informational data. Each operating system includes executable code that controls basic functions of the communication device, such as interaction among the various components included among the internal components 200, communication with external devices via the wireless transceivers 202 and/or the component interface 212, and storage and retrieval of applications and data to and from the memory portion 206. Each application includes executable code that utilizes an operating system to provide more specific functionality for the communication devices, such as file system service and handling of protected and unprotected data stored in the memory portion 206. Informational data is non-executable code or information that can be referenced and/or manipulated by an operating system or application for performing functions of the communication device.

Figure 3:
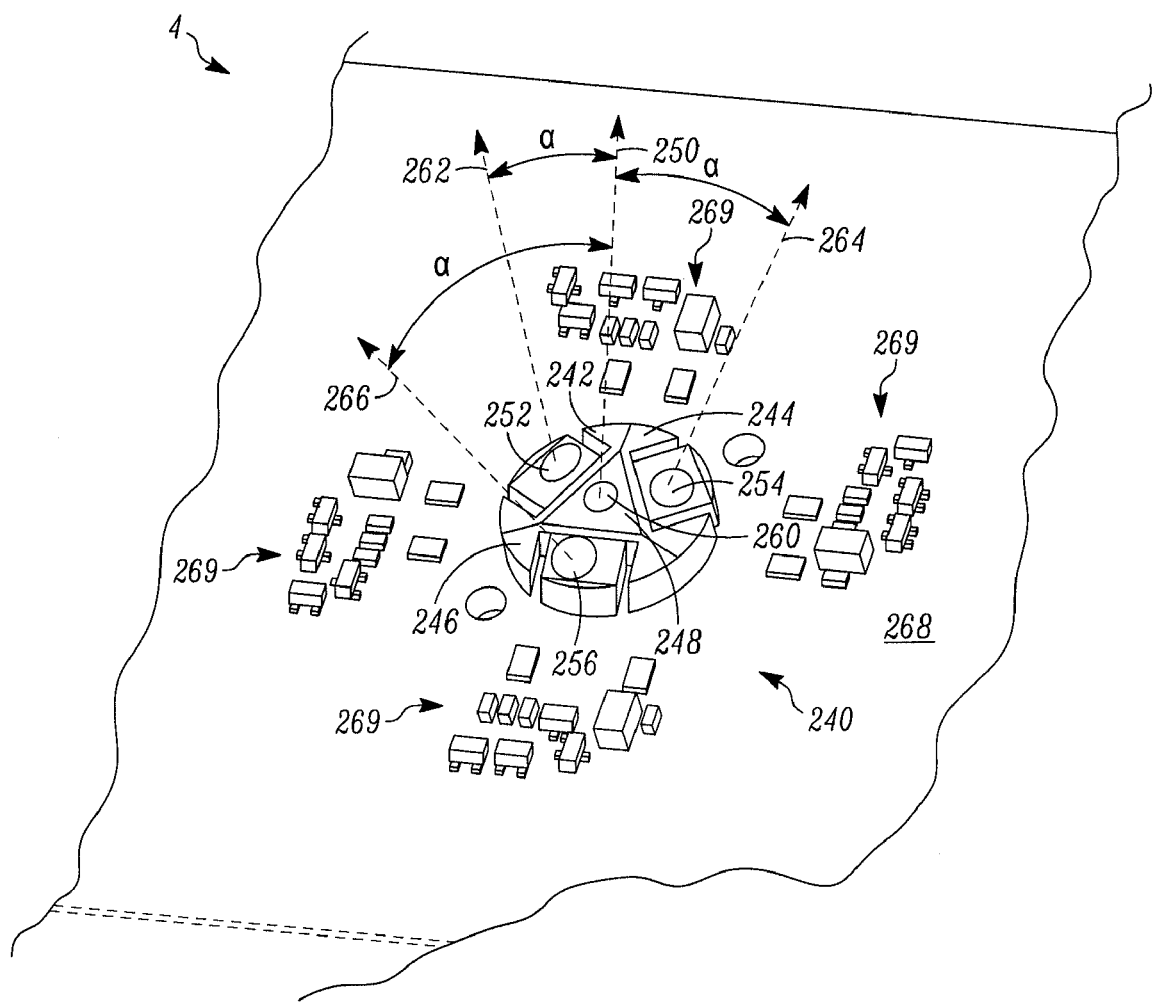
FIG. 3 is a front perspective view showing in more detail components of the pyramid-type sensing assembly of FIG. 3.

Turning to FIG. 3, components of the sensing assembly 4 of FIG. 1 are shown in more detail. As shown, the sensing assembly 4 in particular includes a pyramid-type housing structure 240 that more particularly can be considered a tetrahedral structure that is circular in cross-section and has first, second, and third inclined surfaces 242, 244, and 246, respectively, that extend downward from a triangular top surface 248. Embedded within the respective inclined surfaces 242, 244 and 246, respectively, are first, second and third phototransmitters 252, 254 and 256, respectively, which as noted above can be photo-LEDs suitable for emitting infrared light. The first, second and third phototransmitters 252, 254 and 256, respectively, are particularly oriented in a manner corresponding to the respective inclined surfaces 242, 244 and 246. That is, each of first, second and third center axes of transmission 262, 264 and 266, respectively, extending from the respective phototransmitters is perpendicular/normal to a respective one of the inclined surfaces 242, 244 and 246. Further, each of the center axes of transmission 262, 264 and 266 is generally offset from a perpendicular axis 250 extending perpendicularly/normally from the top surface 248 by an angle α. The perpendicular axis 250 in the present embodiment is also perpendicular to the surface of the video screen 6 and generally to the overall front surface of the mobile device 2 upon which the sensing assembly 4, video screen 6, keypad 8 and navigation device 10 are all mounted.

Further as shown in FIG. 3, the pyramid-type sensing assembly 4 also includes an additional photoelectric device in addition to the phototransmitters 252, 254 and 256 (which themselves are photoelectric devices), namely, a photoreceiver 260 that is mounted along the top surface 248 and, in the present embodiment, is particularly arranged within the center of that surface (e.g., arranged at the center of the isosceles triangular surface). The photoreceiver 260, which as noted above can be a photodiode suitable for receiving infrared light, more particularly is arranged so that its center axis of reception is aligned with the perpendicular axis 250. Therefore, while the respective phototransmitters 252, 254, and 256 are orientated so as to emit light generally about the three center axes of transmission 262, 264 and 266, the photoreceiver 260 is orientated so as to receive light generally about the perpendicular axis 250. In short, the pyramid-type sensing assembly 4 can thus be described as including a single photoreceiver that is surrounded on its sides by three phototransmitters that equally-spaced apart from one another as one proceeds around the photoreceiver, and that are offset in terms of their vertical rotational orientations from the vertical rotational orientation of the photoreceiver by the same angular amount, where all of these components are housed within a tetrahedrally-shaped housing with surfaces that correspond to the rotational orientations of the phototransmitters and photoreceiver.

Due to the particular orientations of the phototransmitters 252-256 and the photoreceiver 260, light from the respective phototransmitters is directed generally in three different directions corresponding to the center axes of transmission 262-266 (although there may be some overlapping of the ranges within which the respective phototransmitters direct light), while the photoreceiver 260 due to its central location and orientation along the perpendicular axis 250 is potentially capable of receiving reflected light from a variety of directions that can overlap the directions of transmission of each of the three of the phototransmitters. More particularly, because the photoreceiver 260 is capable of receiving light from a wider range of angles about the perpendicular axis 250 than the respective ranges about the respective center axes of transmission 262-266 within which the respective phototransmitters are capable of directing light, in the present embodiment the overall sensing assembly 4 operates predicated upon the assumption that the photoreceiver is capable of receiving light that is reflected off of an object such as the hand 11 even though the reflected light may have originated from any one or more of the three phototransmitters.

Further as illustrated in FIG. 3, the components of the sensing assembly 4 described above can be mounted directly upon a circuit board 268 upon which other components such as components 269 are mounted. By virtue of this direct mounting of the sensing assembly 4, the sensing assembly 4 need not protrude out far from the overall surface of the mobile device 2 on which the video screen 6, keypad 8 and navigation device 10 are all situated. In the embodiment of FIG. 3, the sensing assembly 4 is particularly shown to be implemented near a top edge of the front surface of the mobile device 2, which often is the location of a speaker of the mobile device. However, as discussed further below, other positions for such a sensing assembly are also possible.

Figure 4:
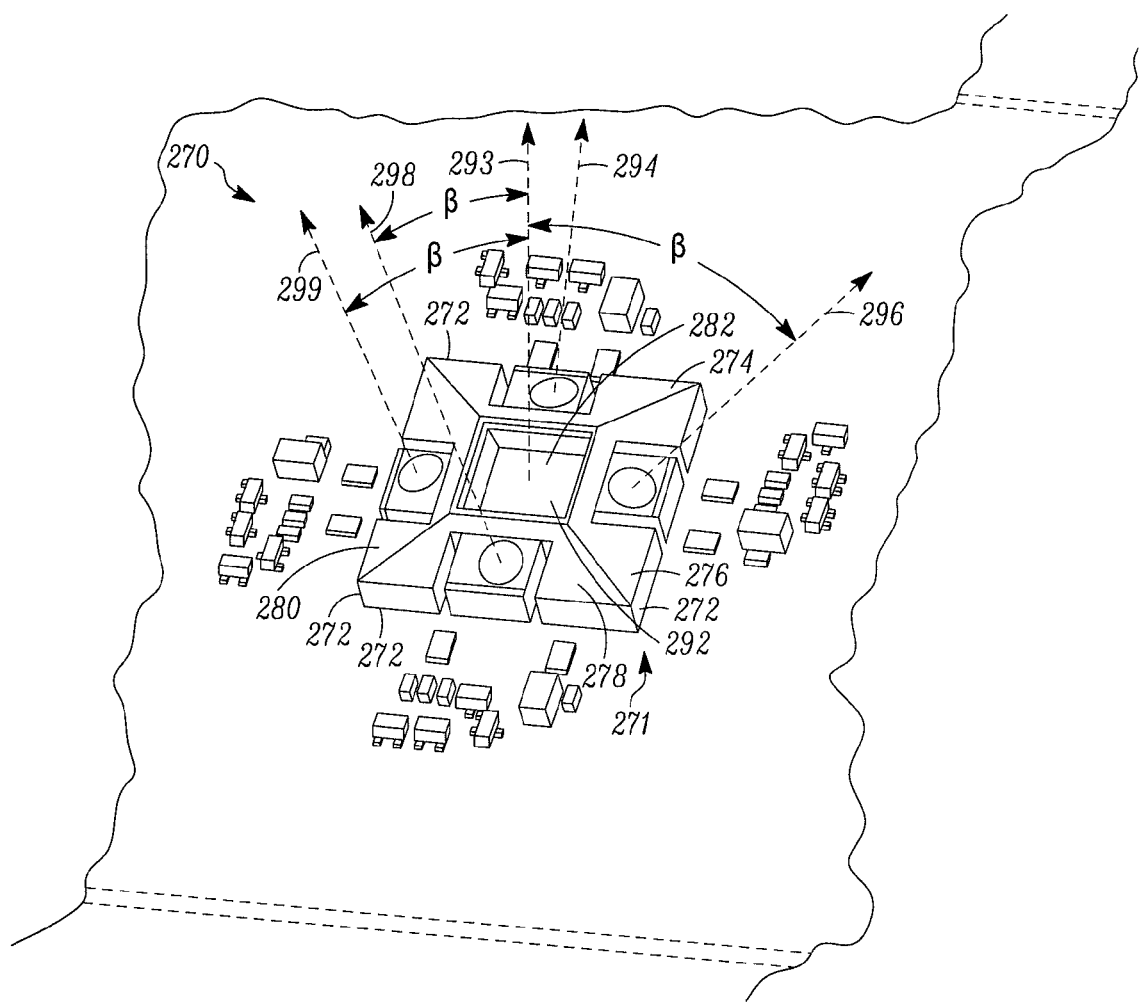
FIG. 4 is a front perspective view showing components of an alternate embodiment of pyramid-type sensing assembly differing from that of FIGS. 1 and 3, in accordance with another embodiment of the present invention.

Turning next to FIG. 4, the present invention is intended to encompass numerous other pyramid-type sensing assemblies other than that shown in FIG. 3. For example, as shown in FIG. 4, in another embodiment a sensing assembly 270 is employed that has a more conventional pyramid-type shape (by comparison with the tetrahedral shape of the sensing assembly 4 described above). More particularly, the sensing assembly 270 has a pyramid-type housing structure 271 having four edges forming a square perimeter 272, and four inclined surfaces 274, 276, 278 and 280, respectively. Similar to the sensing assembly 4 of FIG. 3, the housing structure 271 of the sensing assembly 270 additionally includes a top surface 282 from which each of the respective four inclined surfaces 274, 276, 278 and 280 slope downwardly. As with respect to the sensing assembly 4, along each of the inclined surfaces 274, 276, 278 and 280 is situated a respective phototransmitter (again, for example, a photo-LED) 284, 286, 288, and 290, while the top surface 282 has mounted thereon a photoreceiver (again, for example, a photodiode) 292. Thus, similar to the sensing assembly 4, the sensing assembly 270 includes multiple phototransmitters arranged about (and equally spaced about) a single photoreceiver that is centrally positioned in between the phototransmitters.

Further as shown in FIG. 4, a center axis of reception of the photoreceiver 292 again is aligned with a perpendicular axis 293 normally extending from the top surface 282, which is angularly spaced apart from each of respective first, second, third and fourth center axes of transmission 294, 296, 298 and 299 of the respective phototransmitters 284, 286, 288 and 290 by an angle β. Thus, as with the sensing assembly 4, the respective phototransmitters 284-290 each are vertically rotationally offset relative to the perpendicular axis 293 (and thus relative to the center axis of reception of the photoreceiver 292) in a manner corresponding to the slopes of the respective inclined surfaces 274-280 with which the phototransmitters are associated. Also as with the sensing assembly 4, the photoreceiver 292 is capable of receiving light within a much wider range of angles relative to the perpendicular axis 293 than the respective phototransmitters 284-290 transmit light relative to their respective center axes of transmission 294-299, and operation of the sensing assembly 270 again is predicated upon the assumption that the photoreceiver 292 is capable of receiving light that is reflected off of an external object that may have been transmitted by any one or more of the phototransmitters 284-290.

Figure 5:
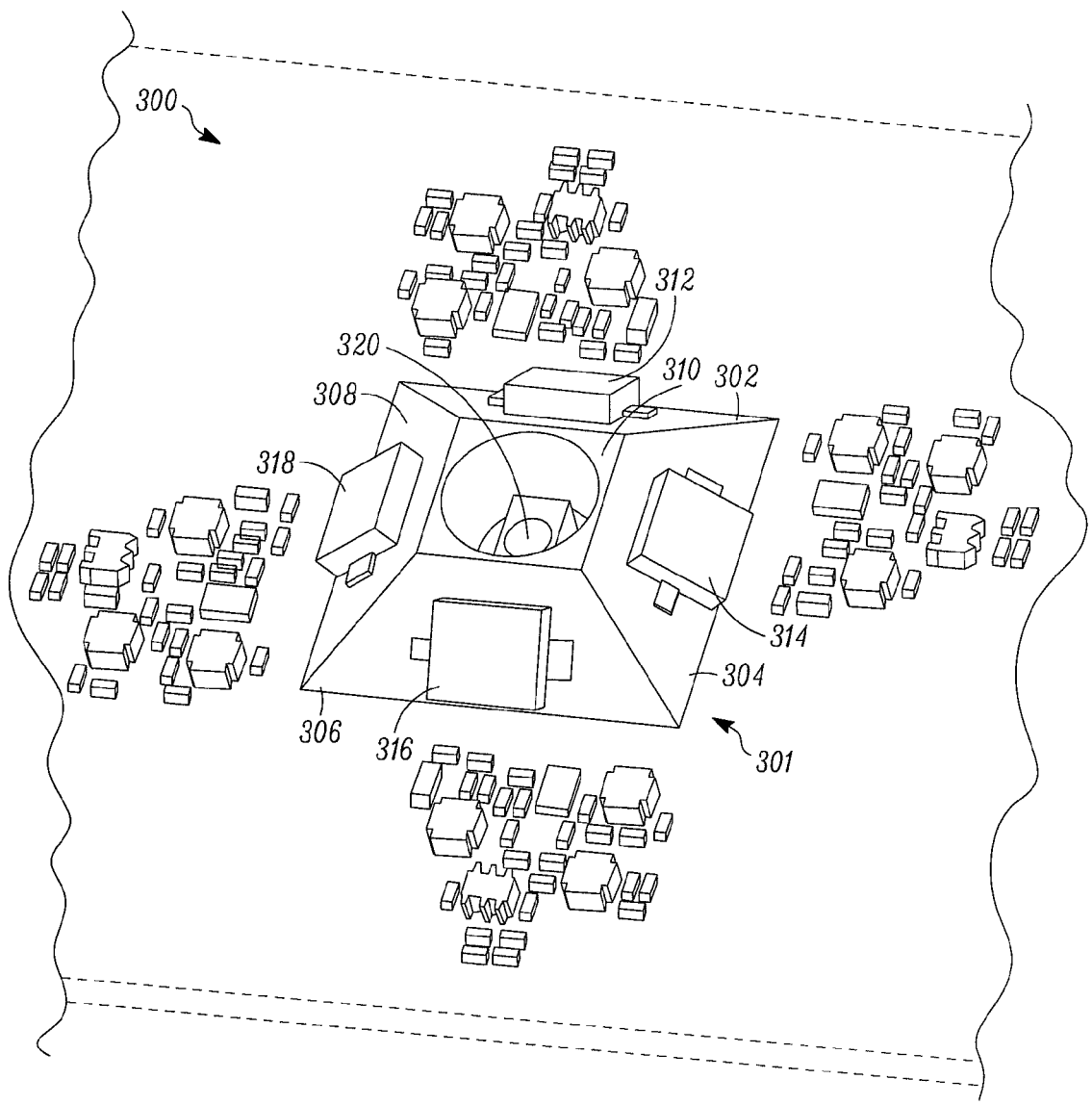
FIG. 5 is a front perspective view showing components of an additional alternate embodiment of pyramid-type sensing assembly differing from those of FIGS. 1, 3 and 4, in accordance with still another embodiment of the present invention.

Referring next to FIG. 5, a further alternate embodiment of a sensing assembly 300 is shown. In this embodiment, the sensing assembly 300 again has a pyramid-type housing structure 301 with four inclined surfaces 302, 304, 306 and 308, respectively, each of which is inclined and slopes downwardly from a horizontal top surface 310. In this embodiment, however, the sensing assembly 300 does not employ phototransmitters on the inclined surfaces 302, 304, 306 and 308, but rather has mounted on those surfaces first, second, third and fourth photoreceivers 312, 314, 316, and 318, respectively. Further, instead of employing a photoreceiver along the top surface 310, instead a phototransmitter 320 is mounted along (or, more particularly, recessed within) that surface. Given this design, in contrast to the embodiments of FIGS. 3 and 4, it is expected that light emitted from the phototransmitter 320, upon being reflected by an object or objects external to the mobile device (e.g., the hand 11), will be reflected to one or more of the photoreceivers 312, 314, 316 and 318, respectively.

Although not shown in FIGS. 3-5, in some circumstances the photoreceivers 260, 292 and 312-318 need not extend up to the very outer surfaces of the sensing assemblies/pyramid-type housing structures, but rather there can be positioned above those photoreceivers additional structures such as transparent windows or walls that provide protection for the photoreceivers and/or provide additional desired optical properties. In some such circumstances, for example, such transparent windows can constitute waveguides (or "V-notches" or Compound Parabolic Concentrator (CPC) waveguides) that serve to better direct incoming reflected light into the photoreceivers, and/or that serve as lenses for magnification purposes, improving gain and/or minimizing local coupling. In some cases, certain portions of the surfaces surrounding the photoreceivers can be coated with silver or copper paint (or other shiny material) so as to reflect infrared light toward the photoreceivers. Also, in some cases, the photoreceivers themselves can be shielded (e.g., electrically shielded) or can be "black diodes" to alleviate background lighting issues, internal reflection/noise and/or noise from the phototransmitters of the sensing assembly. These types of features can be of particular interest in relation to the embodiments such as those of FIGS. 3-4 involving a single photoreceiver.

Further, depending upon the embodiment, the photoreceivers can take a variety of forms including, for example, angle-diversity receivers or fly-eye receivers. Depending upon the embodiment, various filters can be employed above the photoreceivers and/or phototransmitters to filter out undesired light. Different filters can in some circumstances be employed with different ones of the phototransmitters/photoreceivers, for example, to allow for different colors of light to be associated with, transmitted by, or received by, the different components. Additionally, in some embodiments similar to those of FIGS. 3-5 it is desirable to include a grommet or ringlike structure that is positioned in front of a photoreceiver (e.g., a rectangular ring structure above the photoreceiver 292 of FIG. 4). Use of such a grommet/ringlike structure, which can be made of rubber or other appropriate material, is consistent with allowing reflected light from an external object to enter the photoreceiver (that is, the reflected light will pass through the center opening within the grommet/ring to the photoreceiver). At the same time, the use of such a grommet/ringlike structure beneficially serves to shield the photoreceiver from light that, after being emitted by the phototransmitters, is internally reflected directly off of any glass (or other transparent structure) that is positioned in front of the photoreceiver/phototransmitters (such as the video screen/touch screen of a mobile device) without ever having been transmitted to the external object. To achieve this benefit, the grommet/ringlike structure should be positioned in between the photoreceiver/phototransmitters and the glass/transparent structure.

Each of the embodiments of sensing assemblies shown in FIGS. 3, 4 and 5 are similar (notwithstanding their differences) in that multiple phototransmitters and/or photoreceivers are co-located (that is, commonly located) in a single or shared small region, that is, a region that is small by comparison with the overall surface dimensions of the mobile device on which the sensing assemblies are intended to be implemented. Further, in at least these embodiments, it is additionally the case that either only one photoreceiver (where multiple phototransmitters are present) or only one phototransmitter (where multiple photoreceivers are present) is used, although the present invention is also intended to encompass other embodiments in which there are multiple phototransmitters as well as multiple photoreceivers that are co-located. Also, as already mentioned with respect to FIG. 3, in each of these embodiments, the phototransmitter(s)/photoreceiver(s) and associated pyramid-type housing structures can be (but need not be) mounted on a circuit board along with other circuit components.

The co-location of the phototransmitter(s)/photoreceiver(s) mounted in the pyramid-type housing structures in accordance with embodiments such as those of FIGS. 3-5 is beneficial in several regards. First, by virtue of the co-location of photoreceiving and phototransmitting devices in the manners shown, including the particular orientations shown (e.g., relative to the perpendicular axes 250, 293), it is possible for the respective sensing assembly to allow for the sensing not only of the presence of an external object (that is, to detect the fact that the object is within a given distance or proximity relative to the sensing assembly) but also the location of an external object such as the hand 11 in three-dimensional space relative to the sensing assembly. Indeed, this can be accomplished even though, in each of the embodiments of FIGS. 3-5, there is only one of either a phototransmitter or a photoreceiver, as discussed in further detail with reference to FIG. 6 below. Further, by virtue of the co-location of the photoreceiving and phototransmitting devices in the manners shown, in the pyramid-type housing structures, the resulting sensing assemblies are both robust and concentrated (rather than distributed) in design. Thus, the sensing assemblies can potentially be discrete structures that can be implemented in relation to many different types of existing mobile devices, by way of a relatively simple installation process, as add-on or even after-market devices.

It should be noted that the particular angular ranges associated with the transmission or reception of light by the different phototransmitters and photoreceivers associated with sensing assemblies such as those described above can vary with the embodiment and depending upon the intended purpose. As noted earlier, typically photoreceivers can have a range of reception (e.g., a 60 degree range) that is larger than the range of transmission of the phototransmitters (e.g., a 30 degree range). Nevertheless, this need not be the case in all embodiments. That said, it should further be noted that it is anticipated that, in practical implementations, the embodiments of FIGS. 3 and 4 may be superior to that of FIG. 5 insofar as it is commonly the case that the angular range over which a given photoreceiver is capable of receiving light is considerably larger than the angular range over which a phototransmitter is capable of sending light. Also, the use of a single photoreceiver to receive the reflected light arise from multiple phototransmitters as is the case with the embodiments of FIGS. 3-4 typically allows for greater consistency of sensing than a reverse implementation such as that of FIG. 5.

Figure 6:
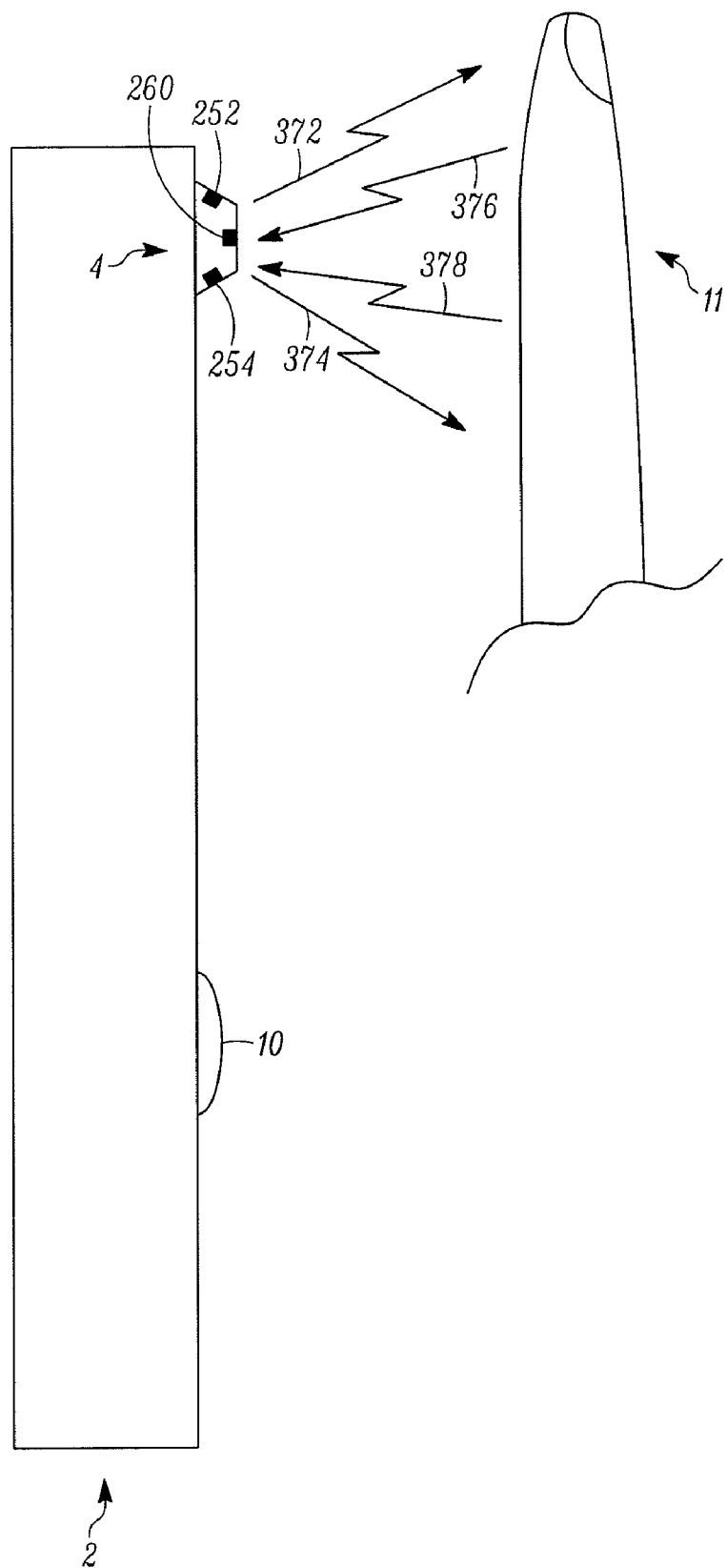
FIG. 6 is a side elevation view of the mobile device, sensing assembly and external object (again shown partially in cut-away) of FIG. 1, illustrating further the manner in which location of the external object is sensed.

Turning to FIG. 6, a side-view of the mobile device 2 and hand 11 of FIG. 1 is provided (with the hand again shown partly in cutaway) to further illustrate how the sensing assembly 4 with its co-located phototransmitters and single photoreceiver is capable of detecting the presence and location of the hand (or a portion thereof, e.g., a finger). As illustrated, when the hand 11 is present and positioned sufficiently proximate the sensing assembly 4, it is often if not typically (or always) the case that the hand will be positioned at a location that is within the range of transmission of light of at least two if not all three of the phototransmitters 252, 254 and 256 of the sensing assembly. In the present example, therefore, when light is transmitted from more than one of the phototransmitters, for example, the phototransmitters 252 and 254 as shown, emitted light 372 and 374 from the respective phototransmitters reaches the hand and is reflected off of the hand so as to generate corresponding amounts of reflected light 376 and 378, respectively. Given the position of the photoreceiver 260 in between the phototransmitters 252, 254, these amounts of reflected light 376, 378 both reach the photoreceiver and are sensed by the photoreceiver as shown.

Figure 7:
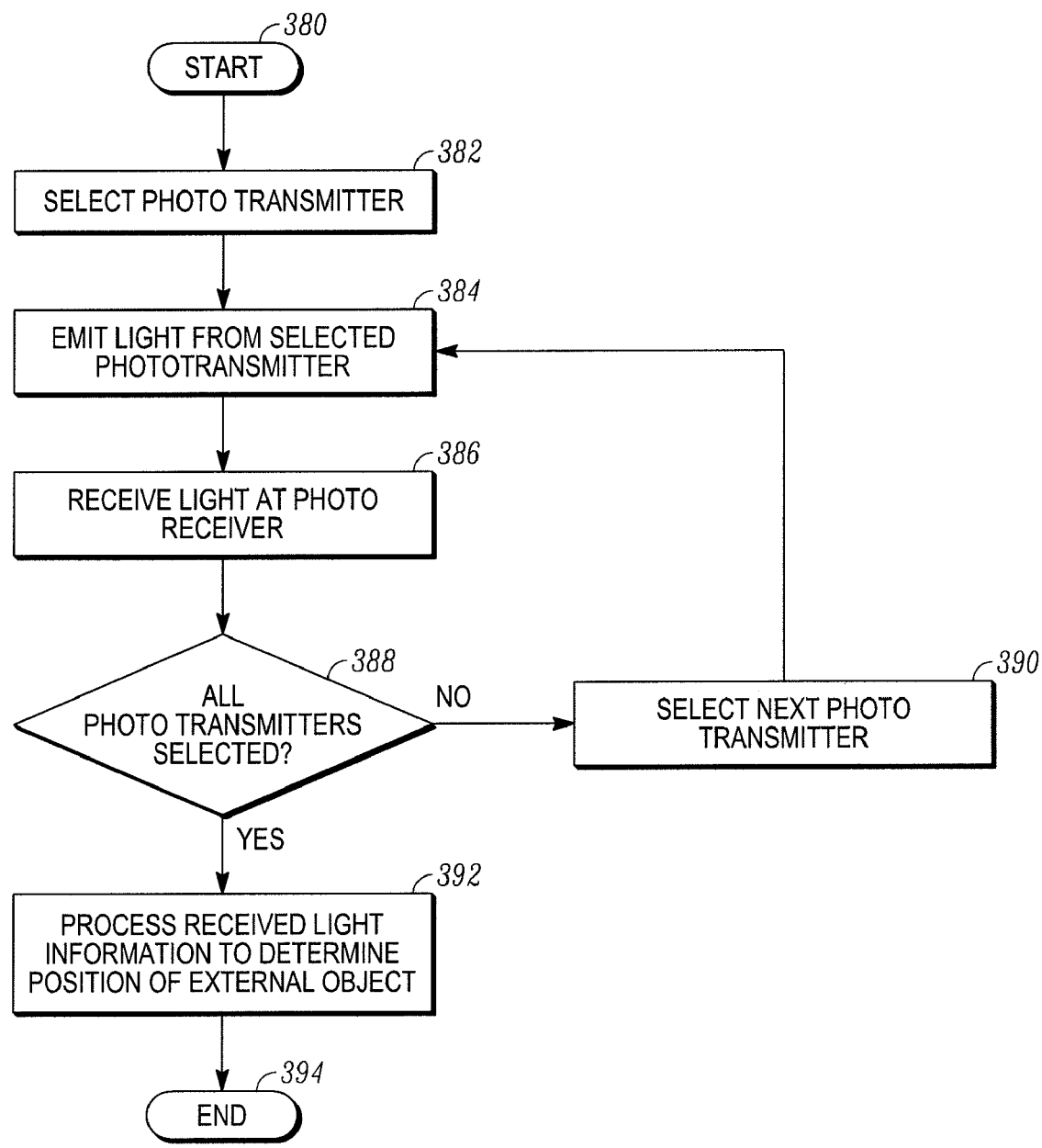
FIG. 7 is a flow chart illustrating exemplary steps of operation of the sensing assembly (and a processing device operating in conjunction therewith), in accordance with at least some embodiments of the present invention.

Referring additionally to FIG. 7, a flow chart is provided that shows in more detail one exemplary manner of operating the components of the sensing assembly 4 so as to determine the location of an external object (e.g., the hand 11). As shown, after starting operation at a step 380, a first of the phototransmitters of the sensing assembly 4 (e.g., the phototransmitter 252) is selected at a step 382. Then at a step 384, the selected phototransmitter is actuated so that infrared light is emitted from that phototransmitter. That light can then proceed towards the external object (e.g., as the emitted light 372 of FIG. 6) and, upon reaching the external object, some of that light is reflected by the external object (e.g., as the reflected light 376). At a step 386 that reflected light is in turn received by the photoreceiver (e.g., the photoreceiver 260) and the photoreceiver correspondingly sends a signal to a processing device (and/or memory device) that records the received information. At a step 388 it is further determined whether all of the phototransmitters have been actuated. If this is not the case, then another of the remaining phototransmitters (e.g., the phototransmitter 254) is selected at a step 390 and then the steps 384-388 are repeated (e.g., such that the emitted light 374 is transmitted and the reflected light 378 is received by the photoreceiver). If however at the step 388 it is determined that all of the phototransmitters have been actuated and, consequently, reflected light signals have been received by the photoreceiver in relation to the light emitted by each of those phototransmitters, then at a step 392 the information from the photoreceiver is processed to determine the location of the external object.

The signal information from the photoreceiver can be processed to determine the location of the external object as follows. The manner of operation described in FIG. 7 effectively constitutes a form of time division multiplexing in which the various phototransmitters are turned on and off one at a time in a serial manner, such that there are successive time windows associated with the actuation of the different phototransmitters. Given that the external object being sensed is positioned relatively close to the transmitters and photoreceiver, these successive time windows not only constitute the respective windows within which the different phototransmitters are actuated but also constitute the respective windows within which light originating at the respective phototransmitters is emitted, reflected off of an external object, and received at the photoreceiver. Thus, the signals provided from the photoreceiver that are indicative of the intensity/amount of light received by the photoreceiver during any given time window can be compared relative to the intensity/amount of light given off by the phototransmitter known to have emitted light during that time window, and such comparisons can serve as a measurement of the proportion of light emitted by a given phototransmitter that actually returns to the photoreceiver due to reflection by the external object. Such measurements in turn serve as indications of the proximity of the external object to the respective phototransmitters and photoreceiver between which the light is communicated.

For such measurements to be more accurate, more particularly, certain additional information can be taken into account, or at least one or more assumptions can be made. For example, such measurements particularly become more accurate as an indication of proximity if one can make an accurate assumption regarding the physical reflectivity of the external object. Further, the physical orientation/position of the phototransmitters and photoreceiver, as well as the angular variations in the transmission and reception sensitivity of the phototransmitters and photoreceiver also can be taken into account. In this respect, and as already discussed, each of the phototransmitters has a respective center axis of transmission and the photoreceiver similarly has a respective center axis of reception. The transmission intensity from the phototransmitters changes (typically decreases) as the angle between that center axis of transmission and the actual direction of transmission increases, and likewise the reception ability of the photoreceiver also changes (typically decreases) as the angle between the center axis of reception and the actual direction of reception increases. Typically, the degrees to which these quantities vary as one moves away from the center axes of transmission or reception are known properties associated with the phototransmitters and photoreceivers.

Assuming then that a processing device has all of these types of information or at least can rely upon reasonable assumptions concerning these issues, the processing device receiving the signals from the photoreceiver (e.g., the processor 204 of FIG. 2, which also can be in control of the actuation of the phototransmitters) is not only able to determine the distance of the external object from the infrared sensing assembly, but more particularly is also able to determine the three-dimensional location of the external object by a type of triangulation calculation (or calculations). More particularly, once the processing device has associated the multiple amplitude (intensity) levels indicated by the photoreceiver as occurring during the different time windows within which multiple phototransmitters have respectively been actuated to transmit light, the processing device can not only determine the amount/intensity of infrared light emanating from each phototransmitter that is reflected back to the photoreceiver but also can compare the relative amounts/intensities of infrared light originating at the different phototransmitters that are reflected back to the photoreceiver, so as to determine the location of the external object relative to the infrared sensing assembly. Generally speaking, as the amounts/intensities of infrared light reflected back to the photoreceiver tend to differ from one another based upon the phototransmitter from which the infrared light originated, this tends to indicate that the external object has shifted to one or another of the sides of the infrared sensing assembly.

For example, if an external object is directly in front of the sensing assembly 4 as shown in FIG. 4, then the intensity of light received by the photoreceiver 260 should be approximately the same regardless of which of the phototransmitters (e.g., which of the phototransmitters 252, 254 as shown, and also the phototransmitter 256) is actuated. Correspondingly, if the signals received from the photoreceiver 260 are the same or nearly the same during each of three successive time windows during which the respective phototransmitters are successively actuated, then processing of this information should determine that the external object is in front of the sensing assembly 4. In contrast, if the received light signal provided by the photoreceiver 260 during the time window corresponding to the actuation of the phototransmitter 252 is much higher than the received light signal provided by the photoreceiver during the time window corresponding to the actuation of the phototransmitters 254 and 256, then processing of this information should determine that the external object is to the side of the sensing assembly 4, closer to the phototransmitter 252 than to either of the other two phototransmitters.

Although the above description of how to determine the location of an external object by way of triangulation particularly envisions the use of information concerning light received at a single photoreceiver originating at multiple phototransmitters (e.g., as is the case in the embodiments of infrared sensing assemblies shown in FIGS. 3 and 4), a similar process is equally applicable where multiple photoreceivers are used to receive multiple different components of reflected light that originated at a single phototransmitter (e.g., as is the case in the embodiment shown in FIG. 5). In all of these embodiments, to the extent that multiple reflected light samples are obtained during a succession of time windows, it is typically assumed that the time windows are sufficiently short that it is unlikely that the external object will have moved significantly during the overall span of time encompassing all of the time windows of interest. Also, while it can be the case that sampling during a single set of time windows (e.g., where only one set of photoemissions as occurred, with each phototransmitter being actuated only once) is adequate to determine the location of an external object, it is also possible that multiple repetitive reflected light samples will be obtained and utilized to determine the location of an external object (e.g., where the processing device not only takes into account multiple samplings of received light occurring as each of the phototransmitters is successively actuated during successive time windows, but also takes into account further samplings of received light as the phototransmitters are successively actuated additional times).

Finally, notwithstanding the general description above of how reflected light information is utilized to determine an external object's location, it will be understood that other additional or different processing steps can also be employed to determine or more closely estimate object location. For example, in some circumstances, it is desirable for background light determinations to be made prior to the making of measurements of reflected light intensity (e.g., before or in between the successive time windows as discussed above), so that background noise can be evaluated and taken into account by the processing device in its calculations, and/or so that the processing device can adjust operational parameters of the phototransmitters and/or photoreceivers such as gain, etc. In this regard, for example, one can consider the disclosures found in U.S. patent application Ser. No. 12/344,760 filed Dec. 29, 2008 and entitled "Portable Electronic Device Having Self-Calibrating Proximity Sensors" and U.S. patent application Ser. No. 12/347,146 filed Dec. 31, 2008 and entitled "Portable Electronic Device Having Directional Proximity Sensors Based on Device Orientation", each of which is hereby incorporated by reference herein, and each of which is assigned to the same beneficial assignee as the present application.

It should be further noted that, in at least some embodiments, operation of the sensing assembly can be limited so as to consider reflected light only originating from certain subset(s) of the available phototransmitters. In some such embodiments where the sensing assembly is implemented in a cellular telephone or PDA, a hand tracking/gesturing offset to a side above the mobile device is enabled by eliminating from the infrared tracking any signals originating from phototransmitters on the side of the sensing assembly that is blocked as a result of the position offset. For example, with respect to the embodiment of FIG. 4, reflected light originating from one of the phototransmitters on a blocked side of the sensing assembly would not be considered in determining the presence/location of an external object (or possibly that phototransmitter would not be actuated to emit light). This manner of operation is workable because, if a human user places a hand above a touchscreen and offset to the right so that the hand does not block a viewing of the touchscreen, reflection from the left side LED of the sensing assembly is almost nonexistent (point away and opposite to hand location) and the other three LEDs are used for hand tracking and vice-versa (as a result, it is possible to track a hand by positioning a hand to the side).

Figure 8:
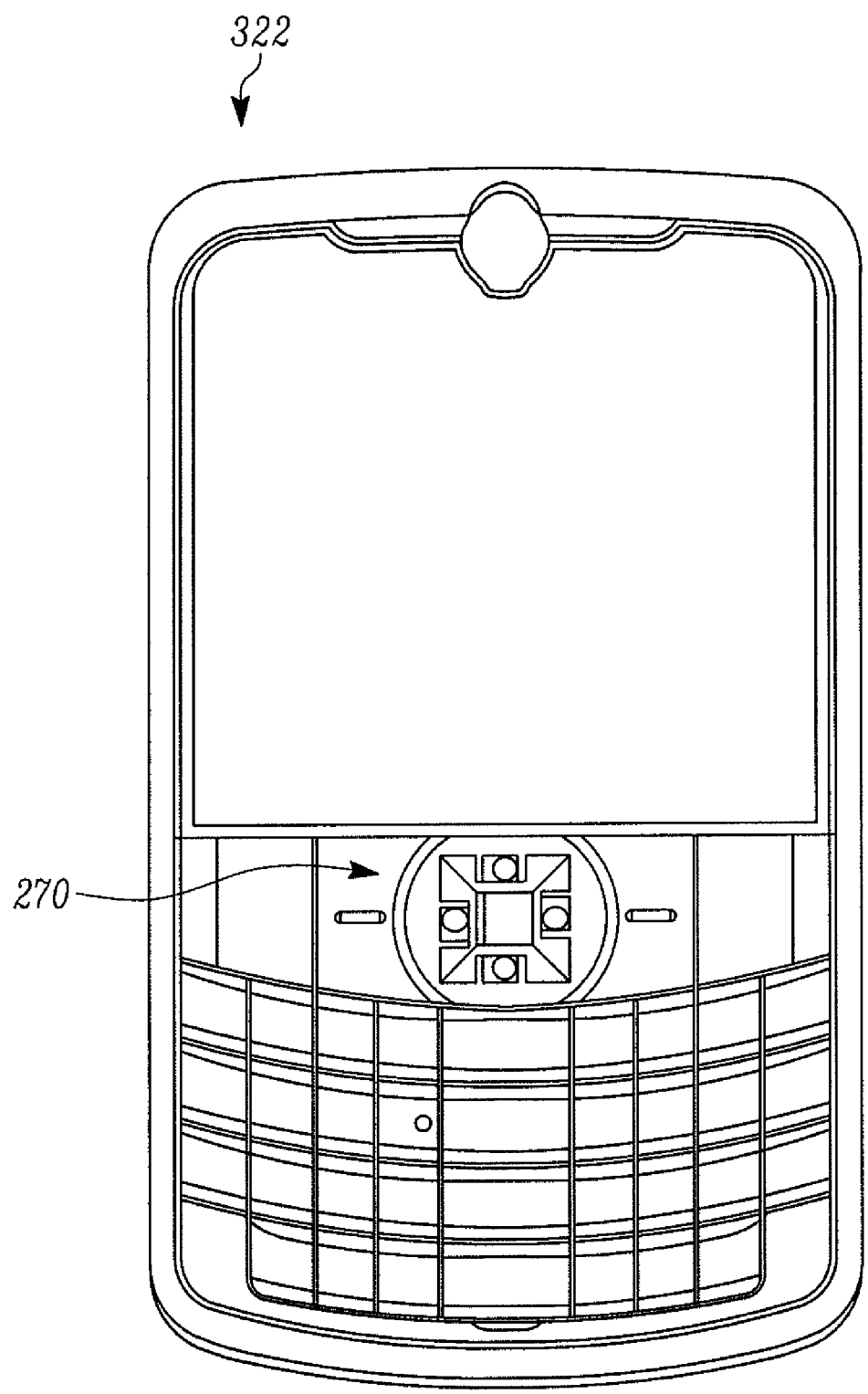
FIGS. 8 and 9 are front elevation views of two additional exemplary mobile devices that each employ the pyramid-type sensing assembly of FIG. 4, in accordance with further additional embodiments of the present invention.
Figure 9:
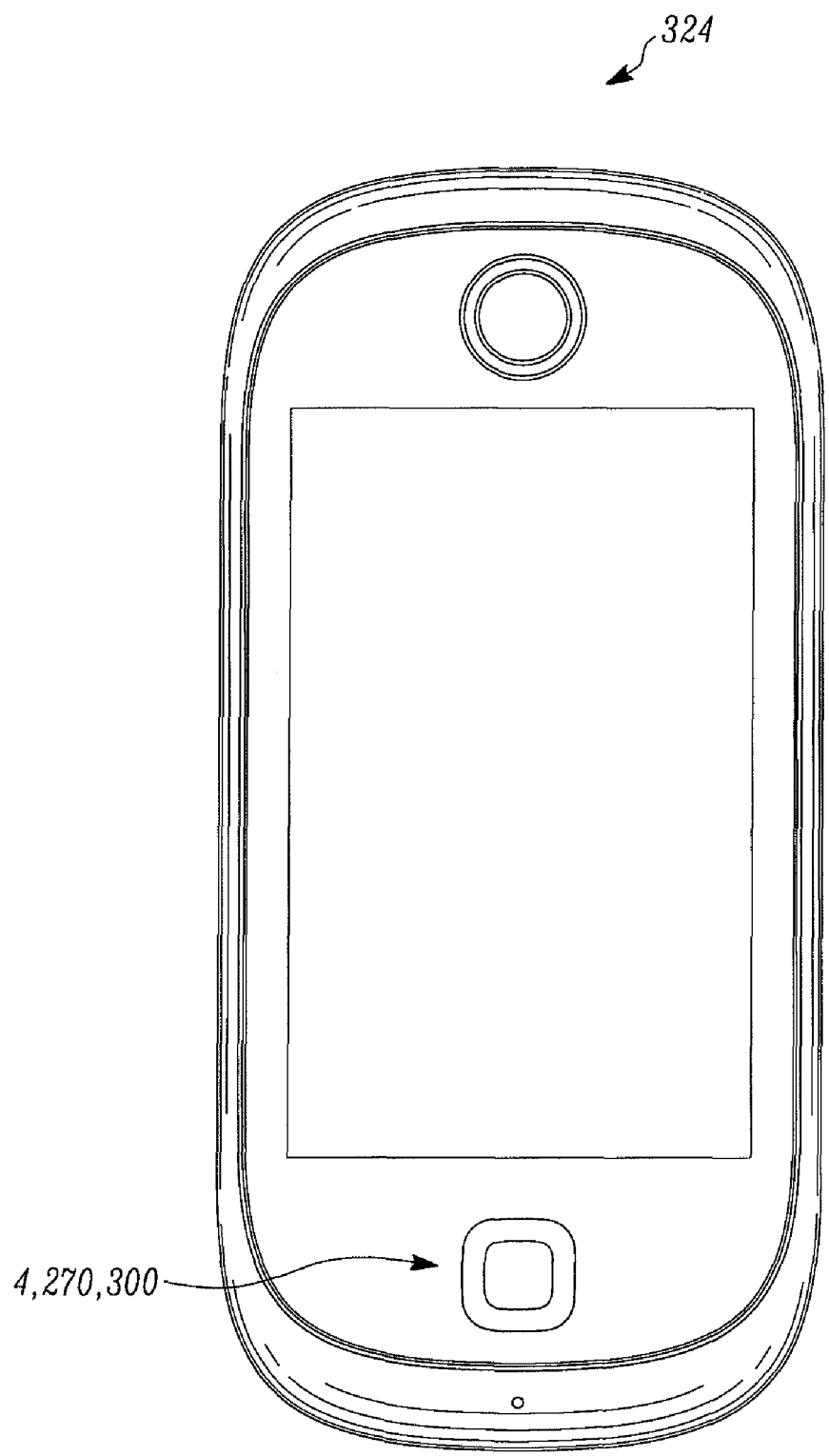

Turning to FIGS. 8 and 9, the positioning of a sensing assembly such as the sensing assemblies 4, 270 and 300 of FIGS. 3-6 can vary depending upon the embodiment and/or the mobile device. As shown in FIG. 8, for example, a sensing device such as the sensing device 270 can be positioned at a location in the middle of the front surface of a mobile device such as a mobile device 322. In some such embodiments, the sensing assembly 270 can be implemented as the navigation device (e.g., as the five-way navigation device), such that the pyramid-type housing structure of the sensing assembly serves not only to house the phototransmitter(s)/photoreceiver(s) but also serves as a button/actuator that can be pressed and/or tilted/rotated relative to the front surface of the mobile device, thereby allowing for hands-free and/or touch-based control.

Also, notwithstanding the embodiment of FIGS. 1 and 6, a sensing assembly can be implemented at either end or along any edge of any given mobile device depending upon the embodiment. For example, as shown in FIG. 9, a sensing assembly 4, 270, 300 such as that of the FIGS. 3-5 can be implemented at the opposite end of a mobile device (e.g., near the bottom of the front surface) 300 rather than at the end shown in FIGS. 1 and 6 (e.g., near the to of the front surface). The mobile device 300 also is intended to illustrate how a sensing assembly such as any of those described above can be implemented on a mobile device in which the entire front surface is a glass or plastic/transparent video screen or touchscreen. It should be noted that blocking problems of the type discussed above (e.g., involving hand positioning) typically do not occur when the sensing assembly is at the bottom of a touchscreen as shown in FIG. 9, albeit in such embodiments it can be desirable to tilt the sensing assembly slightly toward a point nearer to the center of the phone (or to use a lens to achieve such effect).

Although the above-described embodiments all envision the implementation of one or more photoreceivers and phototransmitters along (or recessed within) corresponding walls of a pyramid-type structure, where the respective orientations of those photoreceiver(s)/phototransmitter(s) correspond to the orientations of the respective surfaces of the pyramid-type structure in which those devices are implemented, the present invention should also be understood as encompassing numerous additional embodiments differing from those described above in certain aspects. For example, in at least some embodiments, the photoreceiver(s)/phototransmitter(s), while being held together in a manner by which the various devices maintain relative angular positions that are the same as (or similar to) those described above, nevertheless are not housed within any particular pyramid-type housing structure with specific walls as described above. Indeed, the present invention is intended to encompass embodiments in which there are merely several photoreceiver(s)/phototransmitter(s) that are assembled to one another but have no walls or structures positioned in between those devices.

Also, the above-described embodiments envision particularly the implementation of multiple (e.g., three or more) devices of one type (e.g., phototransmitters or photoreceivers) surrounding a single device of another type (e.g., a photoreceiver or phototransmitter), where the devices of the one type are equally-spaced apart from one another around the device of the other type, where the devices of the one type are all equally spaced apart from the device of the other type, and where the devices of the one type are angularly offset in their orientation relative to the orientation of the device of the other type by a consistent angular amount (e.g., by the angle α or β), other embodiments are also possible. For example, in some alternate embodiments, the devices of the one type need not all be equally spaced apart from one another about the device of the other type, need not all be equidistant from the device of the other type, and/or need not all be offset in their orientation relative to that of the other device by the same amount.

Figure 10:
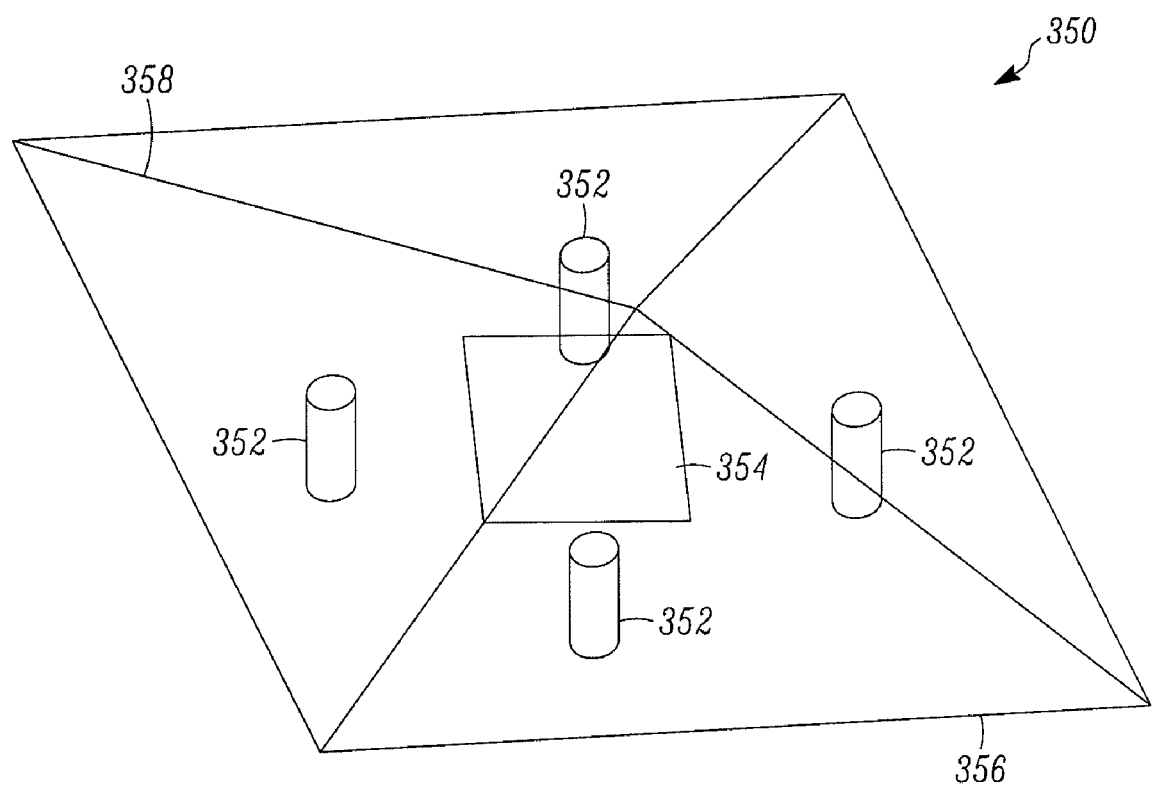
FIG. 10 shows a further alternate embodiment of sensing assembly that differs from that of FIG. 4 in that, instead of being a pyramid-type sensing assembly, the sensing assembly employs a lens that results in the sensing assembly experiencing operational behavior similar to that experienced by pyramid-type sensing assembly of FIG. 4.

In this regard, one exemplary alternate embodiment of a sensing assembly 350 is shown in FIG. 10. As shown, in this embodiment, the sensing assembly 350 like the sensing assembly 270 of FIG. 4 has four phototransmitters 352 spaced around a single photoreceiver 354. However, in contrast to the sensing assembly 270, the phototransmitters 352 each are vertically oriented so as to have center axes of transmission that are parallel to the center axis of reception of the photoreceiver 354. That is, the phototransmitters 352 are not at all offset in their rotational orientation relative to the photoreceiver. Further, a housing 356 within which the phototransmitters 352 and photoreceiver 354 are supported does not necessarily have a pyramidal shape with any inclined surfaces.

Notwithstanding these differences between the sensing assembly 350 and the sensing assembly 270, the sensing assembly 350 nonetheless is able to transmit light and receive reflected light (as reflected by an external object) as if the phototransmitters were rotationally offset relative to the photoreceiver insofar as the sensing assembly 350 additionally includes a pyramid-shaped lens or prism 358 (or possibly multiple lenses in a pyramid-type shape) provided atop the phototransmitters and photoreceiver (or possibly only over one or more of those devices) that refracts/bends the transmitted exiting the sensing assembly/lens and/or refracts/bends the received light incident upon the sensing assembly/lens, such that the overall transmission and reception of light out of and into the sensing assembly proceeds in substantially the same manner as is experienced by the sensing assembly 270. In some circumstances, the lens 358 can be microfilm for beam bending, particularly if the involved angles are small (e.g., 10 to 5 degrees) and the photo-LEDs have relatively narrow transmission ranges (e.g., plus or minus 30 degrees). Although the lens 358 is shown to be of a pyramid-type form that includes four inclined sides sloping away from a tip of the lens (in this case, this tip can be considered a central surface of the lens), in other embodiments, the lens can take a form that is more similar to that of the pyramid-type structures described above in relation to FIGS. 3-5, in which the tip portion of the pyramid is missing such that there exists a central surface that is more extensive (e.g., such as the top surfaces 248, 282 and 310) away from which the inclined surfaces slope.

Figure 11:
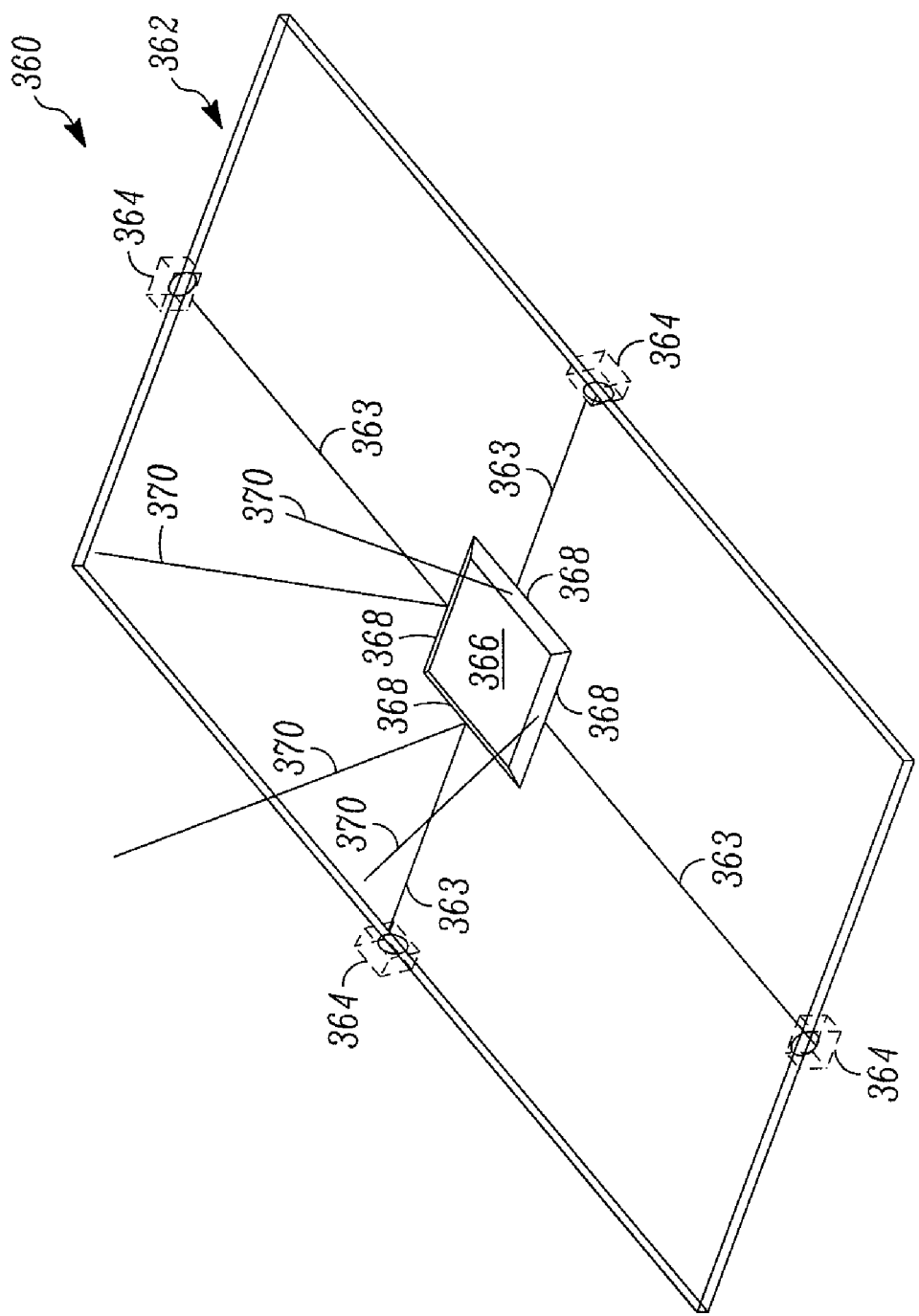
FIG. 11 shows an additional alternate embodiments of sensing assembly differing from those of FIGS. 1-6 and 8-10, which includes a prism/mirror structure that receives light from a plurality of different respective phototransmitters positioned at respective locations apart from one another and apart from the location of the prism/mirror structure.

The present invention further is intended to encompass additional embodiments of sensing assemblies that are particularly useful for implementation in certain types of mobile devices. Referring particularly to FIG. 11, a further sensing assembly 360 is shown to be implemented in relation to a glass (or transparent plastic) video screen or touchscreen 362 as is common in certain types of mobile devices, including for example the mobile device 324 of FIG. 9. As shown, in the embodiment of FIG. 11, the sensing assembly 360 includes four transceivers 364, each of which includes a respective phototransmitter and a respective photoreceiver, and the respective transceivers are respectively positioned at the midpoints of each of the four side edges of the screen 362, respectively. Further as shown, the sensing assembly 360 also includes a pyramid-type formation 366 that is formed as part of (or positioned just beneath) the screen 362. The pyramid-type formation 366 includes four inclined surfaces 368 extending from the four sides of a square top (horizontal) surface 370, where each of the inclined surfaces slopes downwardly from the top surface towards one of the respective edges of the screen 362.

The sensing assembly 360 of FIG. 11 operates as follows. In a first manner of operation, light is transmitted from each of the phototransmitters of the respective transceivers 364 via respective optical waveguides 363 through the screen 362 (or just beneath the screen, parallel to its surface) toward the respective one of the inclined surfaces 368 closest to that respective transceiver. Upon reaching the inclined surfaces, the light is reflected outward from the sensing assembly 360 (and thus from the mobile device on which it is implemented) at various angles depending upon the slopes of the inclined surfaces 368, with the light transmission being centered about respective center axes of transmission 370. Thus, transmitted light emanates from the sensing assembly 360 in much the same manner as if the light had been emitted directly from phototransmitters arranged along the sides of a pyramid-type structure as shown in FIG. 4. Once the light is emitted about the center axes of transmission 370, it can then be reflected off of an external object such as the hand 11 of FIG. 1. Portions of the reflected light eventually are received by one or more of the photoreceivers associated with the respective transceivers 364, and thereby the reflected light is sensed.

Further variations of the sensing assembly 360 are also possible. For example, in one alternate embodiment, rather than reflecting light to be transmitted out of the sensing assembly, the inclined surfaces 368 of the pyramid-type formation 366 instead are intended to reflect incoming reflected light back toward the transceivers 364, at which are located respective photoreceivers. In such embodiments, the phototransmitters of the transceivers 364 can be configured to transmit light directly outward (e.g., perpendicular to the surface of the screen 362) at the locations of the transceivers, with that light in turn being partly or entirely reflected by an external object back toward the pyramid-type formation 366. In further alternate embodiments, rather than employing four transceivers that each have a respective phototransmitter and a respective photoreceiver, only four phototransmitters or four photoreceivers are provided at the locations of the transceivers 364 shown in FIG. 11. In such embodiments, where four phototransmitters are positioned at the edges of the screen 362, a photoreceiver can be positioned along the top surface of the pyramid-type formation and, where four photoreceivers are positioned at the edges of the screen, a phototransmitter can be positioned along the top surface of the pyramid-type formation.

Each of the embodiments described above in relation to FIG. 11 are particularly advantageous insofar as they allow for the use of a pyramid-type formation such as the pyramid-type formation 366 having a height that is considerably less than the heights of the pyramid-type formations of the sensing assemblies 4, 270, 300 described above. Thus, there is no need (or much less need) to have a housing structure protruding outward from the surface of the mobile device. Further the pyramid-type formation 366 can be transparent and thus substantially the same in appearance as the remainder of the screen 362. Thus, the use of such pyramid-type formations such as the formation 366 can be particularly advantageous for use in mobile devices where it is desired that the front surface of the device be a large flat video screen or touchscreen, uninterrupted by bumps or regions where the video screen or touchscreen is unable to display information.

It should be noted with respect to the sensing assembly embodiments of FIGS. 10-11 that, even though the structures employed are different to some extent than those shown in FIGS. 1-6, each of these embodiments nevertheless can be operated in essentially the same manner as is described with reference to FIG. 7. Further, although the lens 358 of FIG. 10 and the pyramid-type formation 366 of FIG. 11 are four-sided pyramid-type structures, in other embodiments other pyramid-type structures (e.g., tetradhedral structures) can also be employed.

Notwithstanding the above discussion, the present invention is intended to encompass numerous other embodiments as well. For example, in some other embodiments, there are only two phototransmitters (and one or more photoreceivers) or only two photoreceivers (and one or more phototransmitters). In other embodiments, there are more than four phototransmitters (and one or more photoreceivers), or more than four photoreceivers (and one or more phototransmitters). Also, while in many embodiments of the present invention the sensing assembly is intended to be mounted to a mobile device in a fixed/stationary manner, which can be advantageous since such manner of mounting can be easily achieved without the need for many complicated components, in some other embodiments it is possible that the sensing assembly is mounted to a mobile device in a tiltable, rotational, or translatable manner to allow for tilting, rotation and/or translation of the sensing assembly relative to the remainder of the mobile device (typically, such tilting, rotation and/or translation would be limited in nature, e.g., as discussed above in the example where the sensing assembly serves as the navigation device). Additionally, while in some embodiments discussed above such as those of FIGS. 3 and 4 the photoreceiver (photodiode) is placed inside the pyramid-type structure (e.g., at the center of the structure), in alternate embodiments the photoreceiver (photodiode) can be positioned on top of or outside of the pyramid-type structure or its center.

Further, although the embodiments discussed above envision a single infrared sensing assembly being implemented on a given mobile device, it is also possible in some other embodiments that multiple infrared sensing assemblies will be implemented on a given mobile device. For example, in some embodiments of mobile devices, two sensing assemblies positioned on diametrically-opposed outer surfaces of the mobile device can be employed so as to allow for the detection of the presence and location of external objects on both sides of the mobile device. Additionally, although the particular tetrahedron and four-sided pyramid structures are described above, it should be understood that other embodiments employing similar structures having multiple inclined surfaces and the like are also encompassed within the present invention. Further, while the use of a lens/pyramid structure for the purpose of bending/refracting light is discussed above with respect to certain embodiments, the bending/refracting of light can also be achieved by having an optical diode placed in a tilted package, or having a tilted lens attached to it (indeed, in some circumstances an infrared photo-LED or photodiode for use as a phototransmitter or photoreceiver will be manufactured by a vendor with such tilted characteristics, which can for example be referred to as "top shoot", "side shoot", or "tilted shoot", among other things).

Also, while in the embodiments discussed above it is envisions that the sensing assembly will be implemented in conjunction with a mobile device or other device, where the mobile device or other device will include the processing device(s) and/or other components appropriate for controlling actuation of the phototransmitter(s) of the sensing assembly, for receiving signals indicative of the receiving of reflected light by the photoreceiver(s), and for determining the presence and location of external object(s) based upon those received signals, in other embodiments it is possible that the sensing assembly will itself include processing device(s) and/or other components as are appropriate (e.g., memory device(s), battery/power source device(s), and input/output terminal(s), etc.) for allowing the sensing assembly to operate by itself in terms of controlling the actuation of its phototransmitter(s), monitoring the operation of its photoreceiver(s), making presence/location determinations, and communicating such presence/location information to other external devices or locations. In some such embodiments, the sensing assembly itself has one or more terminals/ports/interface devices suitable for allowing the sensing assembly to communicate with remote devices via wired or wireless networks including by way of internet-type networks.

Embodiments of the present invention allow for a mobile device, with an appropriate sensing assembly, to achieve beneficial manners of operation based upon the information obtained regarding the presence and location of external object(s). For example, in some mobile devices such as cellular telephones, the presence and location of a human user's phone is of interest and can be used to govern or influence one or more operations of the telephones. To begin, the use of a sensing assembly such as those described above can allow a mobile device such as a cellular telephone to detect whether a human user's hand or ear are proximate a right side of a phone or a left side of a phone, and thereby allow for according adjustments to phone operation. Further for example, the volume of a phone speaker can be automatically adjusted based upon the sensed position of a human user's head. Sensing assemblies such as those described above also can enable tracking without blockage by placing/tracking a hand above the phone offset to the left or right side of the phone using the same sensing assembly.

Also for example, through the use of a sensing assembly such as one or more of those discussed above, it is possible to enable a mobile device to sense and recognize hand gestures that signify user selections or commands. Further for example in this regard, sensed movement of a finger of a human user above the front surface of a mobile device can signify a command by the human user that an image or content displayed on the mobile device be frozen (e.g., to facilitate sending or sharing of the image/content), changed, free/selected (e.g., that a page of information be turned so that a different page of information is displayed), shared, etc., or that a cursor displayed on a screen be moved (e.g., a command such as that often provided by a "mouse"), or that a zoom level or pan setting regarding an image (e.g., a map) be modified. In this manner, such infrared gesturing can serve as a substitute for a touchscreen, where a user need not actually touch the surface of the mobile device to execute a command (albeit the system can still be implemented in a manner that also allows for commands to be recognized when touching does occur). By eliminating the need to touch a screen, disadvantages potentially associated with touching (e.g., fingerprints and other smudging of a video display screen or germ transmission) can be reduced.

In some circumstances, different hand movements or repeated hand movements sensed by way of the sensing assembly of a mobile device can be understood as constituting a first command that a particular variable operational characteristic be selected (e.g., that a volume control icon appear on the video screen of the mobile device) followed by a second command that a setting of the variable operational characteristic be modified (e.g., that the volume be set to a particular level). Particularly in this regard, for example, since infrared sensing assemblies of the type described above are capable of detecting both movements across the assemblies (e.g., horizontal-plane movements) as well as movements toward or away from the assemblies (e.g., vertical-plane movements), a horizontal-plane gesture can be followed by a vertical-plane gesture as an indication of particular commands. Further for example, using such gestures, the horizontal gesture could precipitate a volume (or zoom) adjustor icon to become available while the vertical gesture could in fact cause adjustment in the volume (or zoom) to a desire level. Alternatively, where multiple repeated hand movements are anticipated, the failure of a second or successive hand movement to occur can be interpreted as a command that some other action be taken (e.g., that a cursor or image be recentered or otherwise repositioned).

One example of operation encompassing a number of the above-described considerations would be as follows. Suppose a user placed a hand approximately six inches above a touchscreen and to the right side of a cellular telephone on which an infrared sensing assembly was provided. Immediately, in this instance, the phone might respond by placing a cursor on the right side edge of the touchscreen corresponding to the hand location. However, assuming that the user hand was kept stationary in that location for one second, then the phone might further act to re-center/map the cursors to the middle of the touchscreen (corresponding to the hand being near the right side of the phone). As discussed above, given placement of the hand on the right side of the phone, the phone might operate to track the hand by operating the sensing assembly so that only certain portions of reflected light (e.g., as generated by certain ones of the phototransmitters, for example, three out of four of the phototransmitters of the sensing assembly of FIG. 4, but not the phototransmitter pointing toward the left side of the phone) were considered. Once the user completed an operation of interest (e.g., panning or zooming), the user's hand might remain stationary again and this could signify that the current image should be frozen.

In some embodiments the operation of existing other sensors of a mobile device (e.g., an accelerometer capable of detecting a physical tapping of a navigation device) can be coordinated with the operation of an infrared sensing assembly such as those described above. Indeed, depending upon the embodiment, a variety of other sensors in addition to an infrared sensing assembly can be utilized in detecting commands in a navigation mode of operation and/or to adjust an infrared range accordingly in switching between an infrared sensing mode of operation and a touch-based mode of operation. For example, in some embodiments in which the sensing assembly is implemented as a navigation device, navigation can be achieved by a hand gesture above the sensing assembly (not touching the sensing assembly), followed by pressing of the center of the navigation device to achieve selection. In such a case, infrared reception would go from a maximum level (where the finger was near the sensing assembly) to a minimum level (where the finger blocks reception entirely), and such a maximum to minimum occurrence would be interpreted as constituting a selection input. Alternatively for example, a tap as sensed by another sensor could then precipitate the mobile device's anticipating an imminent user command that would be sensed via the infrared sensing assembly. Also, in some circumstances, sliding of an external object such as a finger directly along the sensing assembly (involving touching) can be recognized as a command.

Mobile devices implementing sensing assemblies such as those described above can be utilized in other contexts as well. For example, a mobile device implementing a sensing assembly such as those described above can be operated so as to recognize the proximity of a surface (e.g., a desktop) to the mobile device, such that the mobile device when positioned and moved over the surface can be utilized as a mouse. Relatedly, by sensing the positioning/tilting of a human user's hand relative to an infrared sensing assembly on a mobile device, mouse-type commands can also be provided to the mobile device. In such applications, it can be particularly desirable to utilize phototransmitters having narrow angular ranges of transmission to allow for high sensitivity in detecting the tilting of a user's hand.

Also, in some embodiments, operation of the sensing assembly itself can be controlled based upon sensed information concerning the location of external object(s). For example, in some cases, the sampling rate (e.g., in terms of the frequency with which the various phototransmitters of a sensing assembly such as the sensing assembly 4 are actuated to emit light) can be modified based upon the proximity of the user, so as to adjust the sensitivity of the location detection based upon the proximity of the user. Indeed, while the manner of operation described with respect to FIG. 7 envisions that the different phototransmitters of a given sensing assembly will be actuated in succession rather than successively, in some cases it may be desirable to actuate all of the phototransmitters simultaneously to increase the overall intensity of the light emitted by the sensing assembly, which can increase the overall amount of reflected light that makes its way back to the photoreceiver and thereby make it possible to sense the proximity of an external object even though the object is a fairly large distance away from the sensing assembly. For example, the range of proximity detection of a sensing assembly can be increased from six inches where the phototransmitters are successively actuated to two feet where all of the phototransmitters are actuated simultaneously (this can be referred to as "super-range proximity detection").

It is specifically intended that the present invention not be limited to the embodiments and illustrations contained herein, but include modified forms of those embodiments including portions of the embodiments and combinations of elements of different embodiments as come within the scope of the following claims.

We claim:

1. An infrared sensing assembly for allowing detection of a location of an external object, the sensing assembly comprising:
    a pyramid-type housing structure having a central surface and a plurality of outer surfaces each of which extends in an inclined manner away from the central surface;
    a plurality of first photoelectric devices, wherein each respective first photoelectric device is positioned proximate to a respective one of the outer surfaces; and
    a second photoelectric device that is positioned proximate to the central surface,
    wherein either each of the first photoelectric devices is a phototransmitter and the second photoelectric device is a photoreceiver, or vice-versa,
    wherein each respective photoelectric device is oriented so as to correspond to the respective surface proximate to which the respective photoelectric device is positioned,
    wherein each of the first photoelectric devices is positioned to emit or receive infrared light about a corresponding central axis that is normal to the respective one of the outer surfaces proximate to which the respective first photoelectric device is positioned, and each central axis is angularly offset from an additional axis extending normally outward from the central surface and is oriented in a different direction with respect to the others of the central axes about the additional axis, wherein the sensing assembly is operated so that infrared light communicated between the one or more phototransmitters and the one or more photoreceivers includes infrared light portions originating at the one or more phototransmitters, whereby the location of the object can be determined based upon the communicated infrared light, which is reflected off of the external object during transit.

2. The infrared sensing assembly of claim 1, wherein each of the one or more photoreceivers has an angular range of reception and each of the one or more phototransmitters has an angular range of transmission, and wherein the angular range of reception is larger than any of the angular ranges of transmission.

3. The infrared sensing assembly of claim 1, wherein each of the one or more phototransmitters is actuated to emit at least some of the infrared light at a respective one or more times.

4. The infrared sensing assembly of claim 3, wherein there are more than one of the phototransmitters, either (a) the respective phototransmitters are actuated in succession, or (b) all of the phototransmitters are actuated simultaneously.

5. The infrared sensing assembly of claim 1, wherein at least one structure is positioned in front of the one or more photoreceivers through which the communicated infrared light must pass in order to arrive at the one or more photoreceivers, and wherein the at least one structure includes one or more of a lens, a waveguide, a filter, and a shield.

6. A mobile device comprising the infrared sensing assembly of claim 1, wherein the mobile device includes at least one processing device, the processing device controlling actuation of the one or more phototransmitters and receiving signals from the one or more photoreceivers, wherein the mobile device is one of a cellular telephone and a personal digital assistant (PDA), and wherein the infrared sensing assembly at least one of (a) is positioned proximate a first edge of the mobile device, (b) is positioned at an interior region of the mobile device, and (c) serves as a navigation device of the mobile device.

7. A mobile device including an infrared sensing assembly by which a determination as to a location of an external object can be made, the mobile device comprising:
at least one photoreceiver;
a plurality of phototransmitters, wherein the respective phototransmitters are actuated to emit respective infrared light portions during respective successive time windows;
a pyramid-type structure having a central surface and a plurality of outer surfaces extending away from the central surface, wherein each outer surface is inclined relative to the central surface; and
a processing device coupled to each one of the at least one photoreceiver and the plurality of phototransmitters,
wherein the processing device makes the determination of the location of the external object based upon a plurality of signals provided at least indirectly to the processing device from the at least one photoreceiver,
wherein each respective signal is indicative of a respective reflected light portion received by the at least one photoreceiver during a respective one of the time windows during which was emitted a respective one of the infrared light portions,
wherein each respective phototransmitter is either oriented in a manner corresponding to a respective orientation of a respective one of the outer surfaces with which the respective phototransmitter is associated, or is actuated to emit the respective infrared light portion for reflection or refraction toward the respective one of the outer surfaces, so that the respective emitted infrared light portions are respectively transmitted away from the mobile device as respective transmitted infrared light portions in respective pluralities of directions about respective central axes that are normal relative to the respective ones of the outer surfaces with which the respective phototransmitters are associated, the central axes being in different directions angularly offset from and about an additional axis extending normally outward from the central surface, and wherein the reflected light portions received by the at least one photoreceiver include the infrared light portions originating at the phototransmitters.

8. The mobile device of claim 7, wherein the at least one photoreceiver includes a first photoreceiver, wherein the infrared sensing assembly includes each of the first photoreceiver, the phototransmitters, and the pyramid-type structure, wherein the first photoreceiver and the phototransmitters are co-located at and supported by the pyramid-type structure, wherein the first photoreceiver is oriented so that a center axis of reception is the additional axis that is normal to the central surface.

9. The mobile device of claim 8, wherein the infrared sensing assembly is implemented as a navigation device on the mobile device, and the navigation device is tiltable relative to a remainder of the mobile device.

10. The mobile device of claim 8, wherein the infrared sensing assembly is mounted on a circuit board or card supported within the mobile device.

11. The mobile device of claim 7, wherein the respective phototransmitters are positioned proximate respective outer edges of the mobile device, wherein the pyramid-type structure is positioned substantially in between the outer edges of the mobile device, and wherein each respective phototransmitter is actuated to emit the respective infrared light portion for reflection toward the respective one of the outer surfaces, which in turn is configured to reflect the light portion outward away from the mobile device as the respective transmitted infrared light portion.

12. The mobile device of claim 11, wherein the at least one photoreceiver either (a) includes a plurality of photoreceivers respectively positioned proximate the respective phototransmitters, or (b) includes a single photoreceiver positioned proximate the central surface of the pyramid-type structure.

13. The mobile device of claim 11, wherein the mobile device has a transparent screen covering substantially all of a first surface of the mobile device, wherein the pyramid-type structure is made from a material that is also substantially transparent, wherein the respective emitted infrared light portions directed from the respective phototransmitters toward the pyramid-type structure are respectively directed by way of respective waveguides extending through or adjacent to the transparent screen, and wherein the infrared sensing assembly of the mobile device includes at least the phototransmitters, the at least one photoreceiver, the waveguides, and the pyramid-type structure.

14. The mobile device of claim 7, wherein the pyramid-type structure forms at least one lens positioned in front of each of the phototransmitters and the at least one photoreceiver, and wherein the emitted infrared light portions and the reflected light portions are refracted by the at least one lens.

15. A method of determining a location of an external object relative to a mobile device, the method comprising:

(a) providing a pyramid-type structure as part of the mobile device, the pyramid-type structure having a central surface and a plurality of outer surfaces extending away from the central surface and being inclined in relation thereto;
(b) actuating a plurality of infrared phototransmitters within a plurality of sequential time windows, respectively, so that respective amounts of infrared light are directed outward away from the mobile device, wherein each phototransmitter is positioned to emit the respective amount of infrared light about a respective central axis of transmission that is normal to the respective one of the outer surfaces with which the respective phototransmitter is associated, and each central axis of transmission is angularly offset from an additional axis extending normally outward from the central surface and is oriented in a different direction about the additional axis with respect to the others of the central axes of transmission;
(c) receiving by way of at least one infrared photoreceiver a plurality of reflected light portions during the plurality of sequential time windows, respectively, wherein each respective one of the reflected light portions includes the respective amount of the infrared light that was directed outward away from the mobile device as a result of the actuating of a respective one of the infrared phototransmitters during the respective sequential time window, and wherein the reflected light portions received by the at least one infrared photoreceiver include the infrared light amounts originating at each of the phototransmitters; and
(d) determining the location of the external object based upon signals from the at least one infrared photoreceiver indicative of the received reflected light portions.

16. The method of claim 15, wherein an infrared sensing assembly of the mobile device includes the phototransmitters, the at least one photoreceiver, and the pyramid-type structure, and further comprising:
(e) repeating (a)-(d) so as to determine that a portion of a body of a user has moved at least one of (i) across and over the infrared sensing assembly, and (ii) toward or away from the infrared sensing assembly.

17. The method of claim 16, wherein either it is determined that both (i) and (ii) have occurred and, in response, the mobile device determines that at least one command has been provided by the user; or the infrared sensing assembly is a navigation device, and it is determined that (ii) has occurred and further that the navigation device has been touched by the user, and in response the mobile device determines that at least one command has been provided by the user.

* * * * *